(12) United States Patent
Hao et al.

(10) Patent No.: US 12,100,239 B2
(45) Date of Patent: Sep. 24, 2024

(54) DISPLAY COMPONENT, DISPLAY SCREEN, AND ELECTRONIC DEVICE

(71) Applicant: HUAWEI TECHNOLOGIES CO., LTD., Guangdong (CN)

(72) Inventors: Ling Hao, Dongguan (CN); Xia Zhang, Dongguan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 17/155,640

(22) Filed: Jan. 22, 2021

(65) Prior Publication Data

US 2021/0142026 A1    May 13, 2021

Related U.S. Application Data

(63) Continuation of application No. PCT/CN2020/082479, filed on Mar. 31, 2020.

(30) Foreign Application Priority Data

May 21, 2019   (CN) .......................... 201910426063.6

(51) Int. Cl.
  *G06V 40/13*      (2022.01)
  *G02F 1/1333*     (2006.01)
  (Continued)

(52) U.S. Cl.
  CPC .... *G06V 40/1318* (2022.01); *G02F 1/133331* (2021.01); *G02F 1/13338* (2013.01);
  (Continued)

(58) Field of Classification Search
  None
  See application file for complete search history.

(56) References Cited

U.S. PATENT DOCUMENTS

| | | | |
|---|---|---|---|
| 2008/0123908 A1* | 5/2008 | Waldman | G06V 40/1324 345/82 |
| 2011/0096009 A1 | 4/2011 | Kurokawa et al. | |

(Continued)

FOREIGN PATENT DOCUMENTS

| | | |
|---|---|---|
| CN | 104751121 A | 7/2015 |
| CN | 105759330 A | 7/2016 |

(Continued)

*Primary Examiner* — Benjamin X Casarez
(74) *Attorney, Agent, or Firm* — WOMBLE BOND DICKINSON (US) LLP

(57) ABSTRACT

A plurality of thin film transistors (TFTs) and a plurality of photo detectors (PDs) are disposed inside a display component. The plurality of PDs convert detected light into electrical signals. The plurality of PDs and the plurality of TFTs are disposed on two opposite inner side surfaces of a same layer of the display component. Projections of the plurality of PDs and the plurality of TFTs on a first plane are alternately distributed, and the first plane is a plane on which the layer at which the plurality of PDs and the plurality of TFT layers are disposed is located. Fingerprint recognition accuracy can be improved by configuring a display screen including the display component provided in the embodiments of this application. In addition, PDs of different quantities are flexibly arranged, to ensure that a large region of the display screen can be used for fingerprint recognition.

11 Claims, 15 Drawing Sheets

(51) Int. Cl.
*G02F 1/1335* (2006.01)
*H10K 50/80* (2023.01)
*H10K 59/40* (2023.01)
*H10K 59/60* (2023.01)
*H10K 59/65* (2023.01)

(52) U.S. Cl.
CPC .. *G02F 1/133504* (2013.01); *G02F 1/133528* (2013.01); *H10K 50/868* (2023.02); *H10K 59/40* (2023.02); *H10K 59/60* (2023.02); *H10K 59/65* (2023.02)

(56) References Cited

U.S. PATENT DOCUMENTS

| | | | |
|---|---|---|---|
| 2012/0321149 A1* | 12/2012 | Carver | G06V 40/1394 |
| | | | 382/124 |
| 2013/0120760 A1 | 5/2013 | Raguin et al. | |
| 2016/0266695 A1 | 9/2016 | Bae et al. | |
| 2017/0299794 A1* | 10/2017 | Fattal | G02B 30/33 |
| 2017/0372113 A1 | 12/2017 | Zhang et al. | |
| 2018/0239455 A1* | 8/2018 | Jia | G06V 40/13 |
| 2018/0373915 A1 | 12/2018 | Ling et al. | |
| 2019/0006620 A1 | 1/2019 | Kim et al. | |
| 2019/0012512 A1* | 1/2019 | He | G06V 40/1324 |
| 2019/0050621 A1* | 2/2019 | Xu | G06V 40/1318 |
| 2019/0056613 A1 | 2/2019 | Wang et al. | |
| 2019/0065812 A1* | 2/2019 | Xu | G06V 40/1324 |
| 2019/0080140 A1* | 3/2019 | Lee | G06F 1/1601 |
| 2019/0102593 A1* | 4/2019 | Wang | G06V 40/1318 |
| 2019/0157492 A1* | 5/2019 | Lai | H01L 27/156 |
| 2019/0197290 A1* | 6/2019 | Chen | G06V 40/1318 |
| 2020/0160023 A1* | 5/2020 | Hu | G06V 40/1318 |
| 2020/0183211 A1* | 6/2020 | Weng | G02F 1/133606 |
| 2020/0241295 A1* | 7/2020 | Fattal | G02B 6/0038 |
| 2020/0348550 A1* | 11/2020 | Wu | G02F 1/13338 |
| 2021/0073505 A1* | 3/2021 | Ye | G06V 40/1318 |
| 2021/0141274 A1* | 5/2021 | Wei | G02B 6/0038 |
| 2021/0365656 A1* | 11/2021 | Xu | G06F 21/32 |

FOREIGN PATENT DOCUMENTS

| | | |
|---|---|---|
| CN | 105789226 A | 7/2016 |
| CN | 106229331 A | 12/2016 |
| CN | 106462765 A | 2/2017 |
| CN | 106897699 A | 6/2017 |
| CN | 107068704 A | 8/2017 |
| CN | 107480584 A | 12/2017 |
| CN | 107563361 A | 1/2018 |
| CN | 107590423 A | 1/2018 |
| CN | 107748874 A | 3/2018 |
| CN | 108258024 A | 7/2018 |
| CN | 108828824 A | 11/2018 |
| CN | 108875622 A | 11/2018 |
| CN | 109031757 A | 12/2018 |
| CN | 109154961 A | 1/2019 |
| CN | 208488936 U | 2/2019 |
| CN | 109417080 A | 3/2019 |
| CN | 109426784 A | 3/2019 |
| CN | 109521586 A | 3/2019 |
| CN | 109541842 A | 3/2019 |
| CN | 109545813 A | 3/2019 |
| CN | 109584711 A | 4/2019 |
| CN | 109643381 A | 4/2019 |
| CN | 110244482 A | 9/2019 |
| EP | 3425670 A1 | 1/2019 |
| KR | 20150029129 A | 3/2015 |
| KR | 20170103755 A | 9/2017 |
| KR | 20190028940 A | 3/2019 |
| WO | 0169520 A2 | 9/2001 |
| WO | 2019085968 A1 | 5/2019 |

\* cited by examiner

DISPLAY COMPONENT, DISPLAY SCREEN, AND ELECTRONIC DEVICE

CROSS-REFERENCE TO RELATED APPLICATIONS

This application is a continuation of International Application No. PCT/CN2020/082479, filed on Mar. 31, 2020, which claims priority to Chinese Patent Application No. CN 201910426063.6 filed on May 21, 2019. The disclosures of the aforementioned applications are hereby incorporated by reference in their entireties.

TECHNICAL FIELD

This application relates to the field of display screen technologies, and in particular, to a display screen with a built-in photo detector (PD) configured for fingerprint recognition.

BACKGROUND

With development and popularization of intelligent terminals, a fingerprint recognition technology is widely applied to the intelligent terminals for identity authentication. Especially in the smartphone field, the fingerprint recognition technology is generally applied to a smartphone to replace a conventional digital password, to implement identity authentication in scenarios such as screen unlocking and mobile payment identity authentication of the smartphone.

The fingerprint recognition technology mainly includes capacitive fingerprint recognition, ultrasonic fingerprint recognition, and optical fingerprint recognition. Optical fingerprint recognition is most widely applied. In the fingerprint recognition technology, a key component is a fingerprint recognition sensor configured to collect fingerprint information. In recent years, a fingerprint recognition sensor applied to the smartphone gradually does not exclusively occupy a panel position but is combined with a display screen, to further increase a screen-to-body ratio of the smartphone. Combining the fingerprint recognition sensor with the display screen is usually referred to as screen fingerprint recognition, under-screen fingerprint recognition, or in-screen fingerprint recognition (hereinafter referred to as screen fingerprint recognition). According to an existing screen fingerprint recognition solution, an operation region used for fingerprint recognition on the display screen is limited only to a region in which the fingerprint recognition sensor is installed and that is under the display screen. Limited by a dimension of the fingerprint recognition sensor, an operation region that can be used for fingerprint recognition in the prior art is not large. As a result, fingerprint recognition in a large region of the display screen or even in any position of the entire display screen cannot be implemented. Moreover, in the existing screen fingerprint recognition solution, a fingerprint recognition module (mainly refers to the fingerprint recognition sensor) occupies physical space under the display screen. In this way, the body thickness of a device for which the fingerprint recognition technology is configured is limited to some extent.

SUMMARY

To resolve a technical problem in the prior art, embodiments of this application provide a display screen with a built-in fingerprint recognition module, to implement a large fingerprint recognition region.

According to a first aspect, an embodiment of this application provides a display component. The display component includes a thin film transistor (TFT) layer, and a plurality of TFTs and a plurality of photo detectors (PD) are disposed at the TFT layer. The plurality of PDs convert detected light into electrical signals. The plurality of PDs are disposed on a first inner side surface of the TFT layer. The plurality of TFTs are disposed on a second inner side surface of the TFT layer. The first inner side surface and the second inner side surface are two opposite inner side surfaces of the TFT layer. Projections of the plurality of PDs and the plurality of TFTs on a first plane are alternately distributed, and the first plane is a plane on which the TFT layer is located. Photosensitive sides of the plurality of PDs face a side close to the first inner side surface.

In an embodiment, the plurality of PDs have same dimensions and specifications, and a plane on which side surfaces, close to the second inner side surface, of the plurality of PDs are located does not intersect a plane on which side surfaces, close to the first inner side surface, of the plurality of TFTs are located.

In an embodiment, a protective layer is disposed on the side surfaces, close to the second inner side surface, of the plurality of PDs, and the plurality of PDs are integrated at the protective layer.

In an embodiment, the display component further includes a collimation structure, and the collimation structure is stacked on an outer side surface, close to the first inner side surface, of the TFT layer.

In an embodiment, the display component further includes a collimation structure. The collimation structure is disposed on a side, close to the first inner side surface, of the TFT layer, and is not in contact with an outer side surface of the TFT layer.

In an embodiment, the display component further includes a collimation structure, and the collimation structure is disposed on a side, close to the second inner side surface, of the TFT layer.

In an embodiment, the collimation structure includes a plurality of transparent structures and a plurality of non-transparent structures. The plurality of transparent structures and the plurality of non-transparent structures are alternately distributed on the collimation structure. Light transmittance of the plurality of transparent structures is greater than a first preset threshold, and light transmittance of the plurality of non-transparent structures is less than a second preset threshold. Optionally, each PD corresponds to one transparent structure.

In an embodiment, the collimation structure includes a plurality of cylindrical structures. The plurality of cylindrical structures are spaced on the collimation structure. Each cylindrical structure has a straight-through hole, and light transmittance of an outer wall of each cylindrical structure is less than a third preset threshold. Optionally, each PD corresponds to a straight-through hole of one cylindrical structure.

In an embodiment, each ring laminated structure includes a plurality of ring structures. The plurality of rings are stacked at a spacing in a thickness direction of the ring laminated structure. Thickness directions of the plurality of rings are consistent with the thickness direction of the ring laminated structure. A material of each ring has a light shielding feature. Optionally, each PD corresponds to one ring laminated structure.

In an embodiment, the collimation structure is a diffractive optical element DOE that has a feature of horizontally transmitting light emitted by an external light source emitter and refracting the light upward in the collimation structure, and the external light source emitter is located on a light incident side of the collimation structure.

In an embodiment, the display component further includes a color filter, the color filter is stacked above the photosensitive sides of the plurality of PDs, and the color filter has a feature of allowing only light within a green light band to pass through.

According to a second aspect, an embodiment of this application provides a display component. The display component includes a color filter and a first substrate. The color filter includes a plurality of pixel regions, and the color filter is disposed on a first side surface of the first substrate. A plurality of photo detectors PDs are disposed on the first substrate, and the plurality of PDs are disposed on the first side surface. Projections of the plurality of PDs and the plurality of pixel regions on a plane on which the first substrate is located are alternately distributed.

In an embodiment, the display component further includes a collimation structure, and the collimation structure is disposed on a side, away from the first side surface, of the first substrate.

In an embodiment, the display component further includes a collimation structure, and the collimation structure is disposed on a side, close to the first side surface, of the first substrate.

In an embodiment, the collimation structure includes a plurality of transparent structures and a plurality of non-transparent structures. The plurality of transparent structures and the plurality of non-transparent structures are alternately distributed on the collimation structure. Light transmittance of the plurality of transparent structures is greater than a first preset threshold, and light transmittance of the plurality of non-transparent structures is less than a second preset threshold. Optionally, each PD corresponds to one transparent structure.

In an embodiment, the collimation structure includes a plurality of cylindrical structures. The plurality of cylindrical structures are spaced on the collimation structure. Each cylindrical structure has a straight-through hole, and light transmittance of an outer wall of each cylindrical structure is less than a third preset threshold. Optionally, each PD corresponds to a straight-through hole of one cylindrical structure.

In an embodiment, the collimation structure includes a plurality of ring laminated structures, and the plurality of ring laminated structures are spaced on the collimation structure. Each ring laminated structure includes a plurality of ring structures. The plurality of rings are stacked at a spacing in a thickness direction of the ring laminated structure. Thickness directions of the plurality of rings are consistent with the thickness direction of the ring laminated structure. A material of each ring has a light shielding feature. Optionally, each PD corresponds to one ring laminated structure.

In an embodiment, the collimation structure is a diffractive optical element DOE that has a feature of horizontally transmitting light emitted by an external light source emitter and refracting the light upward in the collimation structure, and the external light source emitter is located on a light incident side of the collimation structure.

According to a third aspect, an embodiment of this application provides a display screen. A laminated structure of the display screen includes a cover glass, a polarizer, a touch panel, a package cover plate, an electrode layer, a light emitting layer, a thin film transistor (TFT) layer, a base, and a backplate in sequence. A plurality of TFTs and a plurality of photo detectors PDs are disposed at the TFT layer. The plurality of PDs convert detected light into electrical signals, and the plurality of PDs are disposed on a first inner side surface of the TFT layer. The plurality of TFTs are disposed on a second inner side surface of the TFT layer. The first inner side surface and the second inner side surface are two opposite inner side surfaces of the TFT layer. Projections of the plurality of PDs and the plurality of TFTs on a first plane are alternately distributed, and the first plane is a plane on which the TFT layer is located. Photosensitive sides of the plurality of PDs face a side close to the first inner side surface.

The cover glass, the polarizer, the touch panel, the package cover plate, the electrode layer, and the light emitting layer are located on a side, close to the first inner side surface, of the TFT layer. The base and the backplate are located on a side, close to the second inner side surface, of the TFT layer.

In an embodiment, the plurality of PDs have same dimensions and specifications, and a plane on which side surfaces, close to the second inner side surface, of the plurality of PDs are located does not intersect a plane on which side surfaces, close to the first inner side surface, of the plurality of TFTs are located.

In an embodiment, a protective layer is disposed on the side surfaces, close to the second inner side surface, of the plurality of PDs, and the plurality of PDs are integrated at the protective layer.

In an embodiment, the display screen further includes a collimation structure. The collimation structure is located between the light emitting layer and the TFT layer, and is stacked on an outer side surface, close to the first inner side surface, of the TFT layer.

In an embodiment, the display screen further includes a collimation structure, and the collimation structure is located between the cover glass and the polarizer.

In an embodiment, the collimation structure includes a plurality of transparent structures and a plurality of non-transparent structures. The plurality of transparent structures and the plurality of non-transparent structures are alternately distributed on the collimation structure. Light transmittance of the plurality of transparent structures is greater than a first preset threshold, and light transmittance of the plurality of non-transparent structures is less than a second preset threshold. Optionally, each PD corresponds to one transparent structure.

In an embodiment, the collimation structure includes a plurality of cylindrical structures. The plurality of cylindrical structures are spaced on the collimation structure. Each cylindrical structure has a straight-through hole, and light transmittance of an outer wall of each cylindrical structure is less than a third preset threshold. Optionally, each PD corresponds to a straight-through hole of one cylindrical structure.

In an embodiment, the collimation structure includes a plurality of ring laminated structures, and the plurality of ring laminated structures are spaced on the collimation structure. Each ring laminated structure includes a plurality of ring structures. The plurality of rings are stacked at a spacing in a thickness direction of the ring laminated structure. Thickness directions of the plurality of rings are consistent with the thickness direction of the ring laminated structure. A material of each ring has a light shielding feature. Optionally, each PD corresponds to one ring laminated structure.

In an embodiment, the collimation structure is a diffractive optical element DOE that has a feature of horizontally transmitting light emitted by an external light source emitter and refracting the light upward in the collimation structure, and the external light source emitter is located on a light incident side of the collimation structure.

In an embodiment, the display screen includes a color filter. The color filter is stacked above the photosensitive sides of the plurality of PDs, and the color filter has a feature of allowing only light in a green light band to pass through.

According to a fourth aspect, an embodiment of this application provides a display screen. A laminated structure of the display screen includes a cover glass, an upper polarizer, a first substrate, a color filter, a liquid crystal layer, a TFT layer, a second substrate, a lower polarizer, a prism film, a diffuser, and a light guide plate in sequence. The color filter includes a plurality of pixel regions, and the color filter is disposed on a first side surface of the first substrate. A plurality of photo detectors PDs are disposed on the first substrate. The plurality of PDs are disposed on the first side surface, and projections of the plurality of PDs and the plurality of pixel regions on a plane on which the first substrate is located are alternately distributed.

The cover glass, the upper polarizer, the first substrate, the color filter, and the liquid crystal layer are located on a side, close to the first inner side surface, of the TFT layer. The second substrate, the lower polarizer, the prism film, the diffuser, and the light guide plate are located on a side, close to the second inner side surface, of the TFT layer.

In an embodiment, the display screen further includes a collimation structure, and the collimation structure is located between the cover glass and the upper polarizer.

In an embodiment, the display screen further includes a collimation structure, and the collimation structure is located between the lower polarizer and the prism film.

In an embodiment, the collimation structure includes a plurality of transparent structures and a plurality of non-transparent structures. The plurality of transparent structures and the plurality of non-transparent structures are alternately distributed on the collimation structure. Light transmittance of the plurality of transparent structures is greater than a first preset threshold, and light transmittance of the plurality of non-transparent structures is less than a second preset threshold. Optionally, each PD corresponds to one transparent structure.

In an embodiment, the collimation structure includes a plurality of cylindrical structures. The plurality of cylindrical structures are spaced on the collimation structure. Each cylindrical structure has a straight-through hole, and light transmittance of an outer wall of each cylindrical structure is less than a third preset threshold. Optionally, each PD corresponds to a straight-through hole of one cylindrical structure.

In an embodiment, the collimation structure includes a plurality of ring laminated structures, and the plurality of ring laminated structures are spaced on the collimation structure. Each ring laminated structure includes a plurality of ring structures. The plurality of rings are stacked at a spacing in a thickness direction of the ring laminated structure. Thickness directions of the plurality of rings are consistent with the thickness direction of the ring laminated structure. A material of each ring has a light shielding feature. Optionally, each PD corresponds to one ring laminated structure.

In an embodiment, the collimation structure is a diffractive optical element DOE that has a feature of horizontally transmitting light emitted by an external light source emitter and refracting the light upward in the collimation structure, and the external light source emitter is located on a light incident side of the collimation structure.

According to a fifth aspect, an embodiment of this application provides a display screen. A laminated structure of the display screen includes a cover glass, an upper polarizer, a first substrate, a color filter, a liquid crystal layer, a TFT layer, a second substrate, a lower polarizer, a prism film, a diffuser, and a light guide plate in sequence. A plurality of TFTs and a plurality of photo detectors PDs are disposed at the TFT layer. The plurality of PDs convert detected light into electrical signals, and the plurality of PDs are disposed on a first inner side surface of the TFT layer. The plurality of TFTs are disposed on a second inner side surface of the TFT layer. The first inner side surface and the second inner side surface are two opposite inner side surfaces of the TFT layer. Projections of the plurality of PDs and the plurality of TFTs on a first plane are alternately distributed, and the first plane is a plane on which the TFT layer is located. Photosensitive sides of the plurality of PDs face a side close to the first inner side surface.

The cover glass, the upper polarizer, the first substrate, the color filter, and the liquid crystal layer are located on a side, close to the first inner side surface, of the TFT layer. The second substrate, the lower polarizer, the prism film, the diffuser, and the light guide plate are located on a side, close to the second inner side surface, of the TFT layer.

In an embodiment, the display screen further includes a collimation structure, and the collimation structure is located between the cover glass and the upper polarizer.

In an embodiment, the display screen further includes a collimation structure, and the collimation structure is located between the lower polarizer and the prism film.

In an embodiment, the collimation structure includes a plurality of transparent structures and a plurality of non-transparent structures. The plurality of transparent structures and the plurality of non-transparent structures are alternately distributed on the collimation structure. Light transmittance of the plurality of transparent structures is greater than a first preset threshold, and light transmittance of the plurality of non-transparent structures is less than a second preset threshold. Optionally, each PD corresponds to one transparent structure.

In an embodiment, the collimation structure includes a plurality of cylindrical structures. The plurality of cylindrical structures are spaced on the collimation structure. Each cylindrical structure has a straight-through hole, and light transmittance of an outer wall of each cylindrical structure is less than a third preset threshold. Optionally, each PD corresponds to a straight-through hole of one cylindrical structure.

In an embodiment, the collimation structure includes a plurality of ring laminated structures, and the plurality of ring laminated structures are spaced on the collimation structure. Each ring laminated structure includes a plurality of ring structures. The plurality of rings are stacked at a spacing in a thickness direction of the ring laminated structure. Thickness directions of the plurality of rings are consistent with the thickness direction of the ring laminated structure. A material of each ring has a light shielding feature. Optionally, each PD corresponds to one ring laminated structure.

In an embodiment, the collimation structure is a diffractive optical element DOE that has a feature of horizontally transmitting light emitted by an external light source emitter and refracting the light upward in the collimation structure, and the external light source emitter is located on a light incident side of the collimation structure.

According to a sixth aspect, an embodiment of this application provides an electronic device. The electronic device has the display screen described in any one of the third aspect or the possible implementations of the third aspect, or in any one of the fifth aspect or the possible implementations of the fifth aspect.

According to a seventh aspect, an embodiment of this application provides an electronic device. The electronic device has the display component described in any one of the first aspect or the possible implementations of the first aspect, or in any one of the second aspect or the possible implementations of the second aspect.

According to the display screen provided in the embodiments of this application, different quantities of PDs are arranged in the display screen, to implement fingerprint recognition regions of different sizes, and even implement fingerprint recognition in a full-screen range. In addition, compared with a conventional solution in which a sensor configured to collect fingerprint image information is disposed under the display screen, the solution in the embodiments of this application implements a fingerprint recognition effect equivalent to a fingerprint recognition effect implemented in the conventional solution, reduces internal space occupied in a terminal (for example, a smartphone) configured with the display screen, and reduces the thickness of the terminal. Because the display screen provided in the embodiments of this application further includes the collimation structure, the PD can collect a clearer fingerprint image or more accurate fingerprint image information. This can improve precision and security of fingerprint recognition.

DESCRIPTION OF EMBODIMENTS

To make the objectives, technical solutions, and advantages of this application clearer, the following further describes the technical solutions of this application in detail with reference to the accompanying drawings. Apparently, the described embodiments are a part rather than all of the embodiments of the present invention. All other embodiments obtained by a person of ordinary skill in the art based on the embodiments of the present invention without creative efforts shall fall within the protection scope of the present invention.

Currently, fingerprint recognition technologies widely applied in the industry mainly include capacitive fingerprint recognition, ultrasonic fingerprint recognition, and optical fingerprint recognition. Optical fingerprint recognition is applied to a display screen provided in the embodiments of this application. Optical fingerprint recognition is based on a principle of total internal reflection of light. The light falls onto a glass surface on which a fingerprint is pressed. After passing through an optical path, the reflected light is obtained by a receiver, and is usually obtained by an optical-to-electrical converter. Strength of the reflected light is related to distribution of a valley and a ridge of the fingerprint pressed on the glass surface. In this way, fingerprint image information is obtained.

The following are nouns and corresponding English expressions or English abbreviations that may be used in the embodiments of this application.

| Chinese expression | English expression | English acronyms and abbreviations |
|---|---|---|
| 液晶显示器 | Liquid Crystal Display | LCD |
| 有机发光二极管 | Organic Light-Emitting Diode | OLED |
| 量子点发光二极管 | Quantum Dot Light Emitting Diode | QLED |
| 微型发光二极管 | Micro Light Emitting Diodes | uLED |
| 互补型金属氧化物半导体 | complementary metal-oxide-semiconductor | CMOS |
| 互补型金属氧化物半导体图像传感器 | CMOS imaging sensor | CIS |
| 光电检测器 | photo detector | PD |
| 盖板 | cover glass | CG |
| 触控屏 | touch panel | TP |
| 薄膜晶体管 | thin film transistor | TFT |
| 彩色滤光片 | color filter | CF |
| 黑色矩阵区域 | black matrix | BM |
| 光学透明胶 | optically clear adhesive | OCA |
| 压敏胶 | pressure sensitive adhesive | PSA |
| 偏振片 | polarizer | POL |
| 背板 | backplate | |
| 聚对苯二甲酸乙二酯 | polyethylene terephthalate | PET |
| 聚甲基丙烯酸甲酯 | poly (methyl methacrylate) plate | PMMA |
| 二氧化硅 | | SiO$_2$ |
| 衍射光学元件 | diffractive optical elements | DOE |
| 光纤通道 | fiber channel | |

Figure 1:
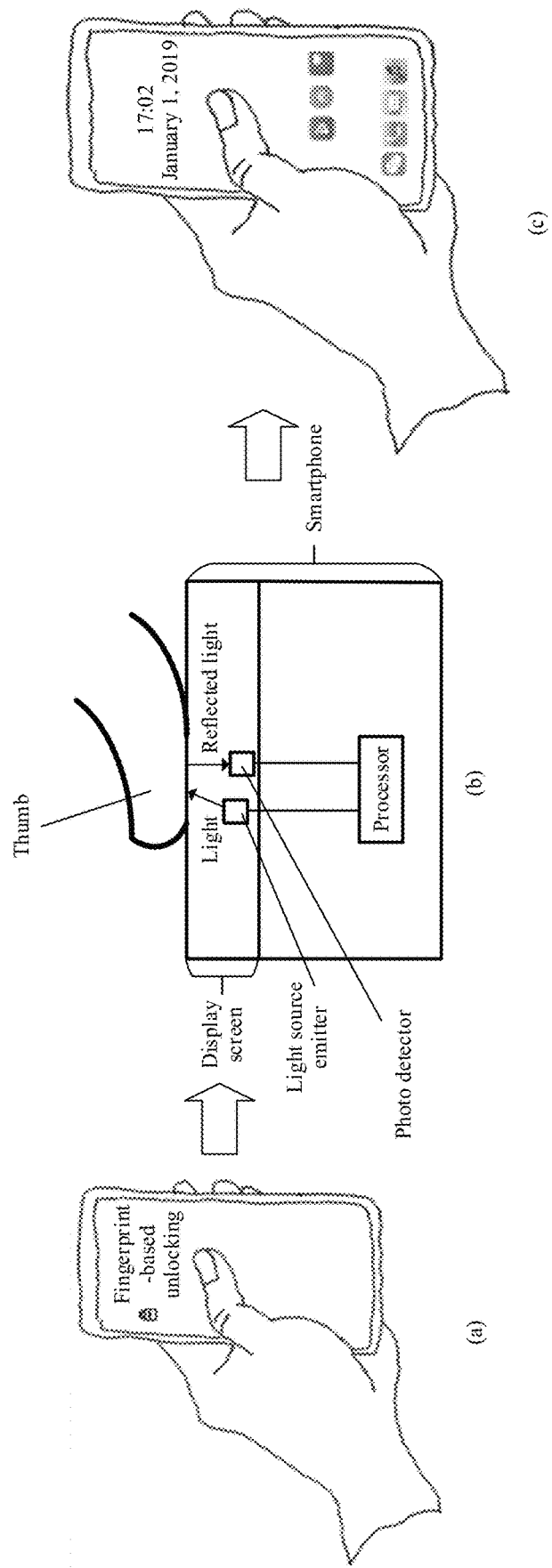
FIG. 1 is a schematic diagram of a scenario in which a smartphone is unlocked through fingerprint recognition according to an embodiment of this application.

As shown in FIG. 1, an embodiment of this application provides a scenario in which a smartphone is unlocked through fingerprint recognition. As shown in FIG. 1(a), a user holds the smartphone, and randomly presses a position in a fingerprint recognition region on a display screen of the smartphone by using a thumb of the user, to touch the display screen of the smartphone. When the smartphone is in a screen-locked state, the action of touching the display screen by using the thumb of the user triggers a function of unlocking the smartphone through fingerprint recognition. As shown in FIG. 1(b), under control of a processor, a light source emitter in the display screen of the smartphone emits light. The light emitted by the light source emitter is transmitted to a surface of the thumb that is in contact with the display screen, and is reflected by the surface of the thumb that is in contact with the display screen to form the reflected light, and the reflected light is transmitted to a PD (PD). The reflected light carries fingerprint information of the thumb. The PD converts the received reflected light into an electrical signal including the fingerprint information, to complete collection of the fingerprint information of the thumb, where the electrical signal may also be referred to as a photogenerated current. A circuit connected to the PD sends the photogenerated current to the processor of the smartphone in a form of an electrical signal. The processor may obtain fingerprint image information after processing the received electrical signal, and use the fingerprint image information for identity authentication. After the identity authentication is successful, the processor controls the smartphone to switch from the screen-locked state to an unlocked state. As shown in FIG. 1(c), a system desktop, another default interface, an application interface, or the like is displayed after the smartphone is unlocked. Other scenarios in which identity authentication needs to be performed through fingerprint recognition are similar to the unlocking scenario of the smartphone, and are not enumerated herein.

It should be noted that FIG. 1 shows a simple example of unlocking the smartphone through fingerprint recognition, and this example cannot be considered as any limitation on this application and other embodiments. In this example, an arrow representing light is only used to indicate that the light emitted by the light source emitter is transmitted to the surface of the thumb, and is not used to indicate that all light emitted by the light source emitter needs to be transmitted to the surface of the thumb, and a specific path and manner of transmitting the light in the display screen are not limited. Similarly, a specific path and manner of transmitting, in the display screen, the reflected light emitted from the surface of the thumb are not limited, and not all reflected light emitted from the surface of the thumb needs to be transmitted to the PD. For brief description, FIG. 1(b) only shows a simple framework of the smartphone, and does not show other components of the smartphone or all components related to fingerprint recognition. Other components related to fingerprint recognition are described in detail in the following corresponding embodiments. It can be learned from FIG. 1(b) that the light source emitter and the PD are disposed in the display screen. A specific structural relationship is described in detail in the following corresponding embodiments. During specific implementation, a quantity of PDs needs to be correspondingly increased, to implement a large-area or full-screen fingerprint recognition function on the display screen.

To better describe a display screen with a built-in fingerprint recognition module provided in the embodiments of this application, the following briefly describes main structures of two common conventional display screens.

Figure 2:
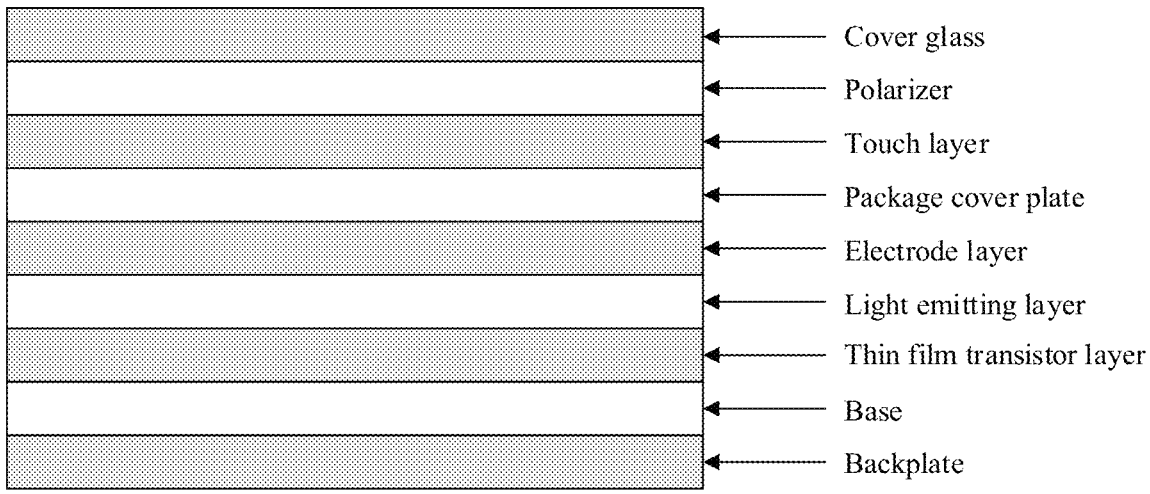
FIG. 2 is a schematic structural diagram of a conventional organic light-emitting diode OLED display screen according to an embodiment of this application.

As shown in FIG. 2, a laminated structure of a conventional organic light-emitting diode (OLED) display screen includes a cover, a polarizer, a touch panel, a package cover plate, an electrode layer, a light emitting layer, a TFT layer, a base, and a backplate. It should be noted that FIG. 2 is merely a schematic diagram of the laminated structure of the OLED display screen, and does not show all components or laminated layers of the OLED display screen. Actually, the OLED display screen may further include another laminated layer and component, for example, a material that is located between two laminated layers and that bonds the two laminated layers, or a protective film. A person skilled in the art can understand a specific laminated structure of the conventional OLED display screen, a function of each laminated layer, and a principle of implementing a displaying effect. This is not limited herein.

Figure 3:
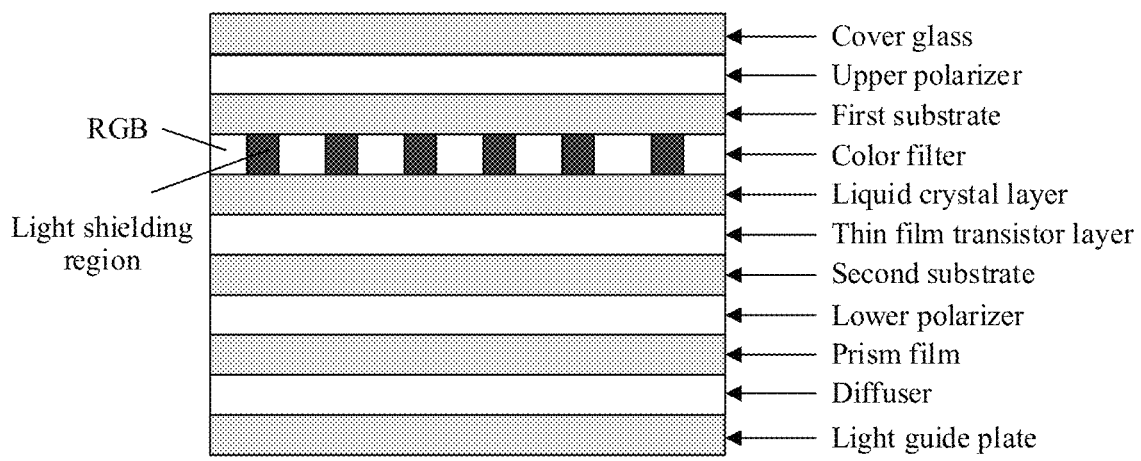
FIG. 3 is a schematic structural diagram of a conventional liquid crystal display LCD according to an embodiment of this application.

As shown in FIG. 3, a laminated structure of a conventional liquid crystal display (LCD) includes a cover, an upper polarizer, a first substrate (a color filter substrate), a color filter, a liquid crystal layer, a TFT layer, a second substrate (e.g., a TFT substrate), a lower polarizer, a prism film, a diffuser, and a light guide plate. A backlight system includes the prism film, the diffuser, and the light guide plate. It should be noted that FIG. 3 is merely a schematic diagram of the laminated structure of the LCD, and does not show all components or laminated layers of the LCD. Actually, the LCD may further include another laminated layer and component, for example, a material that is located between two laminated layers and that bonds the two laminated layers, or a protective film. A person skilled in the art can understand a specific laminated structure of the conventional LCD, a function of each laminated layer, and a principle of implementing a displaying effect. This is not limited herein.

Figure 4:
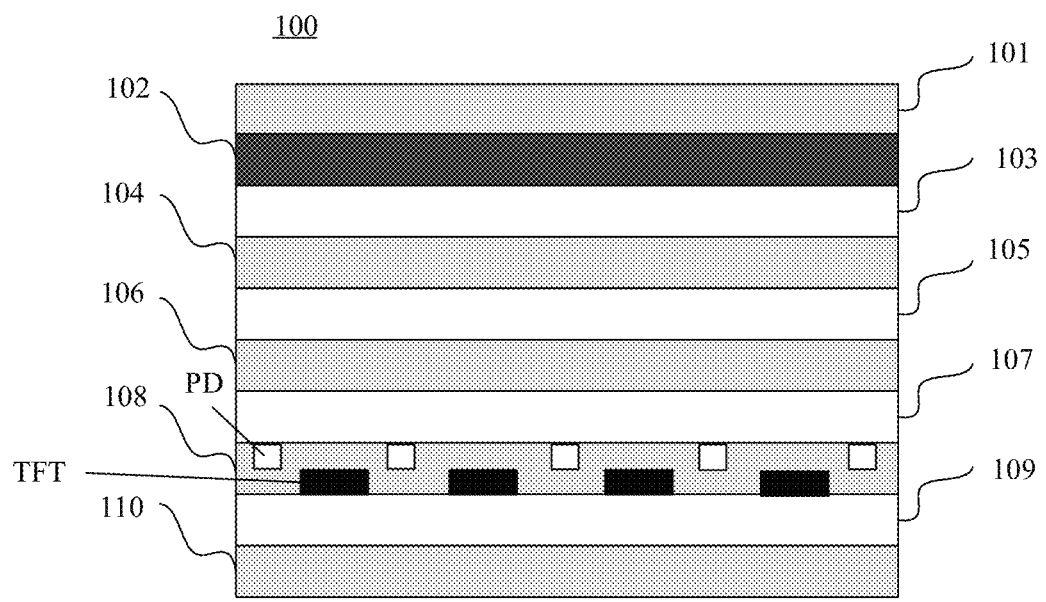
FIG. 4 is a schematic structural diagram of a display screen with a built-in fingerprint recognition module according to an embodiment of this application.
Figure 5:
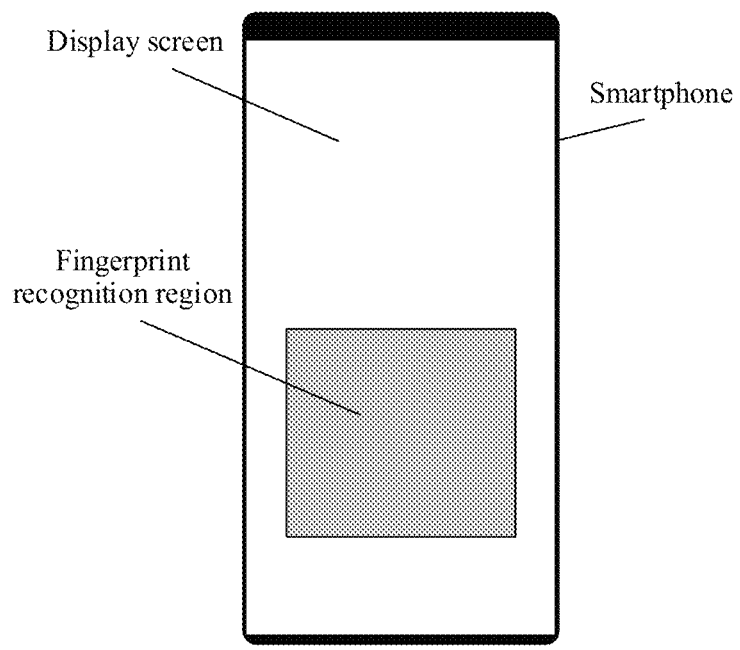
FIG. 5 is a schematic diagram of a fingerprint recognition region on a smartphone according to an embodiment of this application.

An embodiment of this application provides a display screen 100 with a built-in fingerprint recognition module. The fingerprint recognition module includes a collimation structure and a PD. The display screen 100 is an OLED display screen. Refer to FIG. 5. A smartphone is used as an example. A display screen assembled for the smartphone in FIG. 5 is the display screen 100. FIG. 4 is a schematic diagram of a longitudinal section of a part that is of the display screen 100 and that is used as a fingerprint recognition region. The fingerprint recognition region is a part that can be used for fingerprint recognition on the display screen. It should be noted that the fingerprint recognition region shown in FIG. 5 is merely an example. During specific implementation, the fingerprint recognition region of the display screen 100 may be increased or decreased based on a requirement, or even the full display screen may be used as the fingerprint recognition region. As shown in FIG. 4, a laminated structure of the display screen 100 includes a cover glass 101, the collimation structure 102, a polarizer 103, a touch panel 104, a package cover plate 105, an electrode layer 106, a light emitting layer 107, a TFT layer 108, a base 109, and a backplate 110 in sequence from top to bottom (in other words, from outside to inside, where the outside refers to a side, facing a user, of the display screen, and the inside refers to a side facing an interior of the display screen; such an understanding is also applicable to the following similar descriptions). In an embodiment of this application, a combination of the polarizer 103 and the touch panel 104 is referred to as a touch panel module. The cover glass 101 may be made of glass, plastic, or another material. This is not limited in this embodiment of this application, and a different material may be selected based on an actual requirement. The thickness of the cover glass 101 usually ranges from 0.2 mm to 0.6 mm, and is preferably about 0.5 mm. Optionally, a refractive index of the cover glass 101 is about 1.51, and transmittance of the cover glass 101 is at least 93%. During specific implementation, the cover glass 101 and the collimation structure 102 may be bonded by using an optically clear adhesive (OCA). The thickness of the OCA ranges from 0.1 mm to 0.15 mm, and transmittance of the OCA is greater than 96%. The OCA may be made of acrylate. The polarizer 103 is a circular polarizer with the thickness ranging from 0.06 mm to 0.15 mm, a refractive index of about 1.50, and transmittance greater than 40%. The thickness of the touch panel 104 ranges from 0.04 mm to 0.07 mm. The touch panel 104 may be bonded to the polarizer 103 in an integrated manner. Optionally, the touch panel 104 may alternatively be bonded to a panel in an integrated manner, that is, the touch panel 104 is integrated into the package cover plate 105 in the panel. The panel is a light-emitting core layer of the display screen 100. The light emitting layer 107 included in the panel may be formed through multi-layer evaporation. The package cover plate 105 on a surface of the panel may be a thin protective film. The thickness of the package cover plate 105 ranges from 0.025 mm to 0.035 mm.

It should be noted that materials and specification parameters of the foregoing laminated layers are not limited in this embodiment of this application. In addition, FIG. 4 is a schematic structural diagram of the display screen 100, and does not show all laminated layers or components of the display screen 100, and the laminated layers and the components in FIG. 4 are not drawn strictly according to a scale. Unless otherwise specified, dimensions in FIG. 4 cannot constitute a limitation on the display screen 100 provided in this embodiment of this application.

It should be noted that two adjacent laminated layers may be bonded by using an existing process. A specific bonding process is not limited in this embodiment of this application. In this embodiment of this application, main laminated layers and components in the laminated structure of the display screen 100, and a component and a laminated layer that are related to this embodiment of this application are described, to clearly describe a difference between the display screen 100 and a conventional OLED display screen.

Compared with the conventional OLED display screen shown in FIG. 2, the display screen 100 provided in this embodiment of this application further includes the collimation structure 102 under the cover glass 101. The collimation structure 102 may be an optical fiber panel or a collimation film. The collimation structure 102 may be a collimation structure shown in FIG. 6.

Figure 6:
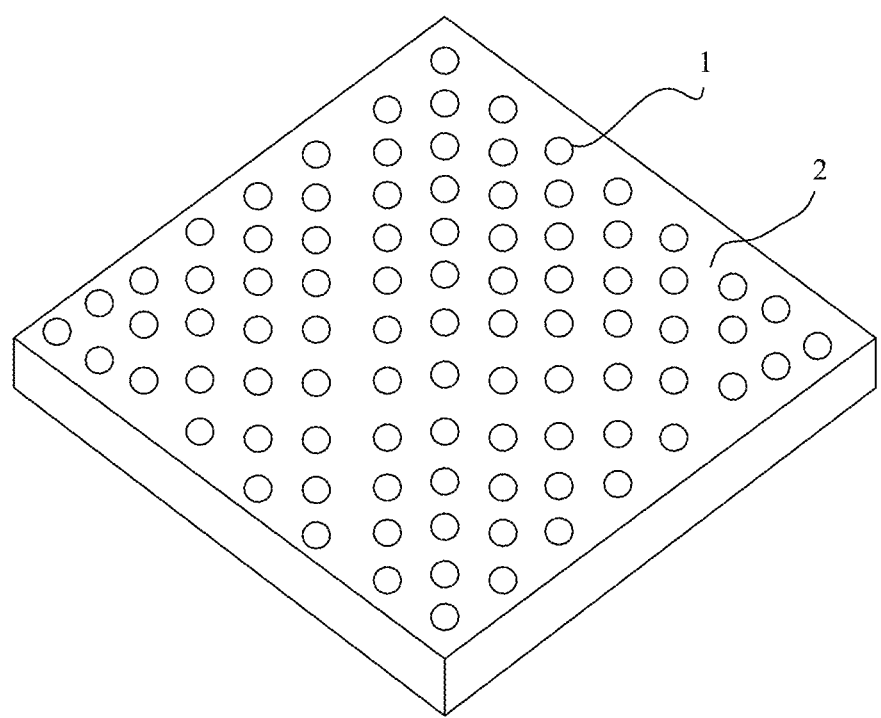
FIG. 6 is a schematic diagram of a collimation structure according to an embodiment of this application.

An embodiment of this application provides a collimation structure. The collimation structure may be applied to the display screen 100. As shown in FIG. 6, the collimation structure includes a plurality of optical fiber transparent structures 1 (a structure represented by a circle in FIG. 6 is an optical fiber transparent structure 1 that may also be referred to as an optical fiber through-hole structure) and a plurality of non-transparent structures 2 with a particular light absorption rate (a region between circles in FIG. 6 represents a non-transparent structure 2). There is a particular difference between a refractive index of the optical fiber transparent structure 1 and a refractive index of the non-transparent structure 2. It can be learned from FIG. 6 that the optical fiber transparent structures 1 and the non-transparent structures 2 are evenly and alternately distributed. To be specific, any non-transparent structure 2 is located in a region between two or more optical fiber transparent structures 1. In other words, any optical fiber transparent structure 1 is located in a region between two or more non-transparent structures 2. The collimation structure functions as follows: When light rays arrive at a surface of the collimation structure, a light ray at a relatively large angle cannot pass through the optical fiber transparent structure 1, and a light ray at a relatively small angle can pass through the optical fiber transparent structure 1. In this way, total internal reflection of light within a given angle, namely, a light reflection effect, can be implemented. The light ray at the relatively large angle is absorbed by the non-transparent structure 2. In this way, an angle of a reflected light ray can be further selected. That is, when only a light ray within a given angle range passes through, the reflected light ray can be collimated, to reduce crosstalk between light rays. The collimation structure shown in FIG. 6 may be made of silicon dioxide SiO2, or may be made of polyethylene terephthalate PET, polymethyl methacrylate (PMMA), or the like. The thickness of the collimation structure ranges from 0.05 mm to 0.5 mm. Light transmittance of the optical fiber transparent structure 1 in the collimation structure is greater than 95%. An aperture of the optical fiber transparent structure 1 ranges from 5 um to 50 um. A spacing between the optical fiber transparent structures 1 ranges from 10 um to 50 um. A shape of the optical fiber transparent structure 1 is not limited to a circle, a triangle, a square, a hexagon, or the like. The non-transparent structure 2 may be made of a doped composite material, and has light transmittance of 0% to 20%. The non-transparent structures 2 may be evenly distributed in regions between the optical fiber transparent structures 1. Further, the spacing between the optical fiber transparent structures 1 in the collimation structure 102 is very small, and an area of a single non-transparent structure 2 located in a region between the optical fiber transparent structures 1 is also very small. Therefore, normal displaying performed by the display screen 100 is not affected.

It is further noted that different apertures, spacings, thicknesses, and material light transmittance for the optical fiber transparent structure 1 can be set to select light at different angles and implement overall positive light transmittance of the collimation structure. A fused biconical taper process, a laser photoetching process, a nanoimprinting process or an injection molding process may be performed on a material of the collimation structure to form holes, and the optical fiber transparent structures 1 are placed in the holes.

In an embodiment, during design and manufacturing of the collimation structure 102 of the display screen 100, the optical fiber transparent structures 1 included in the collimation structure 102 may be designed based on a PD arrangement mentioned below, so that there is a corresponding optical fiber transparent structure 1 right above each PD. It should be noted that an aperture dimension of the optical fiber transparent structure 1 is usually less than a dimension of the PD. In an optional solution, when the aperture dimension of the optical fiber transparent structure 1 is less than the dimension of the PD, the optical fiber transparent structures 1 may not one-to-one correspond to PDs.

Figure 7:
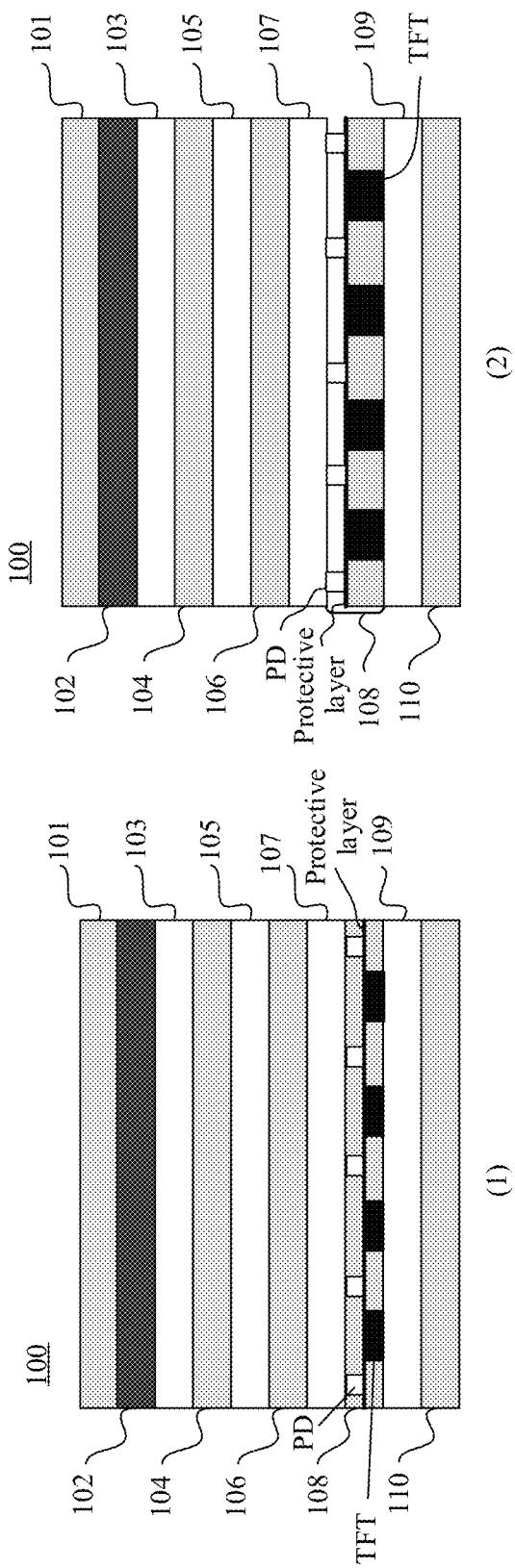
FIG. 7 is a schematic diagram of two manners of disposing a photo detector PD according to an embodiment of this application.
Figure 8:
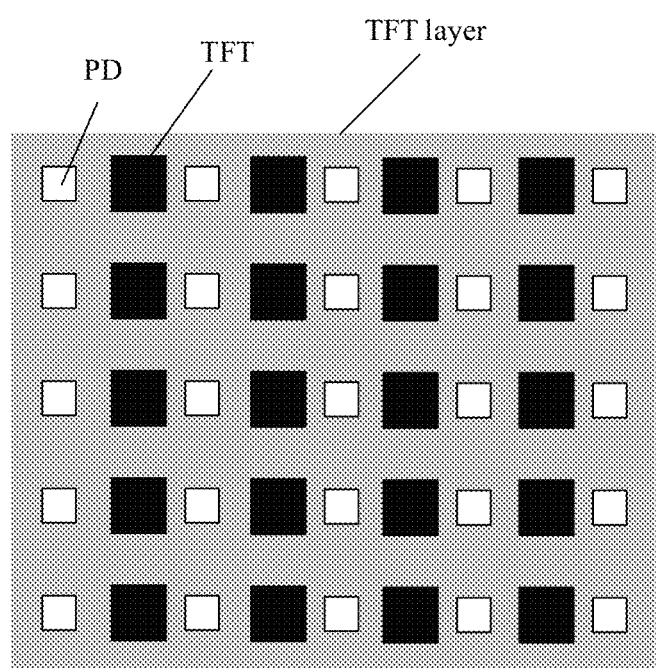
FIG. 8 is a schematic diagram of a position relationship between a photo detector PD and a thin film transistor TFT according to an embodiment of this application.

Further, compared with the conventional OLED display screen shown in FIG. 2, the display screen 100 provided in this embodiment of this application further includes a plurality of PDs that are configured to collect fingerprint information and that are disposed in a region of the corresponding TFT layer 108 under the fingerprint recognition region. As shown in FIG. 4, structurally, the plurality of PDs disposed at the TFT layer 108 may constitute a plane. The plane may be referred to as a PD layer to better conceptually distinguish from the TFT layer. It should be noted that the PD layer and the TFT layer 108 may be collectively referred to as the TFT layer 108. A quantity of PDs is related to a size of the fingerprint recognition region. Generally, a larger fingerprint recognition region indicates a larger PD layer, in other words, a larger quantity of PDs. Refer to FIG. 7 and FIG. 8. A PD is disposed above a region between two TFTs. It may be understood that, in the conventional OLED display screen, the TFT is disposed at a position corresponding to a pixel array in the light emitting layer 107. For example, there is a red-green-blue (RGB) pixel array at the light emitting layer 107, and the TFT is located under an RGB pixel in the light emitting layer 107. Therefore, the PD located in the region between the two TFTs does not occupy space under a pixel region in the light emitting layer 107, in other words, light (for example, light reflected from a thumb) may be transmitted to the PD through a region between pixels in the light emitting layer 107. Optionally, all the PDs have same specifications, upper surfaces of all the PDs are on a same horizontal plane, and lower surfaces of all the PDs are on a same horizontal plane. In an embodiment, a gap is reserved between the light emitting layer 107 and the horizontal plane on which the upper surfaces are located. In a specific implementation, optionally, as shown in FIG. 7(1), specifications of the TFT are correspondingly adjusted. The height of the TFT is lowered, and a height lowered for the TFT may be slightly greater than the height of the PD. The plurality of PDs are disposed in a spatial region obtained after the height of the TFT is adjusted at the TFT layer 108. Optionally, a protective layer is added under the PD layer, and the plurality of PDs may be integrated at the protective layer by using a semiconductor process. As shown in FIG. 7(2), structurally, the PD layer used to dispose the plurality of PDs is added between the light emitting layer 107 and the TFT layer 108, and a protective layer is added between the PD layer and the TFT layer 108. The protective layer is mainly used to fasten the PD and/or arrange some cables, and separate the PD layer from the TFT layer 108 for protection. It should be noted that, in the structure shown in FIG. 7(2), the PD layer may be considered as an internal layer of the TFT layer 108. In other words, the solution shown in FIG. 7(1) and the solution shown in FIG. 7(2) are structurally consistent, and are mainly different in implementations. FIG. 7(1) shows an implementation in which space used for disposing the PD is obtained by adjusting the specifications of the TFT, and FIG. 7(2) shows an implementation in which the PD is disposed above the TFT layer, in other words, a layer of space is added to dispose the PD. Compared with the solution shown in FIG. 7(2), the solution shown in FIG. 7(1) can support disposing of the PD in the display screen without increasing the thickness of the display screen.

It should be noted that the PD is a component including a photosensitive side, and the photosensitive side of the PD is a side on which light can be received. In this embodiment of the present invention, a direction of the photosensitive side of the PD may be learned by a person skilled in the art to implement a fingerprint recognition function. In this embodiment of the present invention, the photosensitive side of the PD faces upward, that is, faces a direction of the cover glass. This description is not provided again in the following embodiments.

Figure 9:
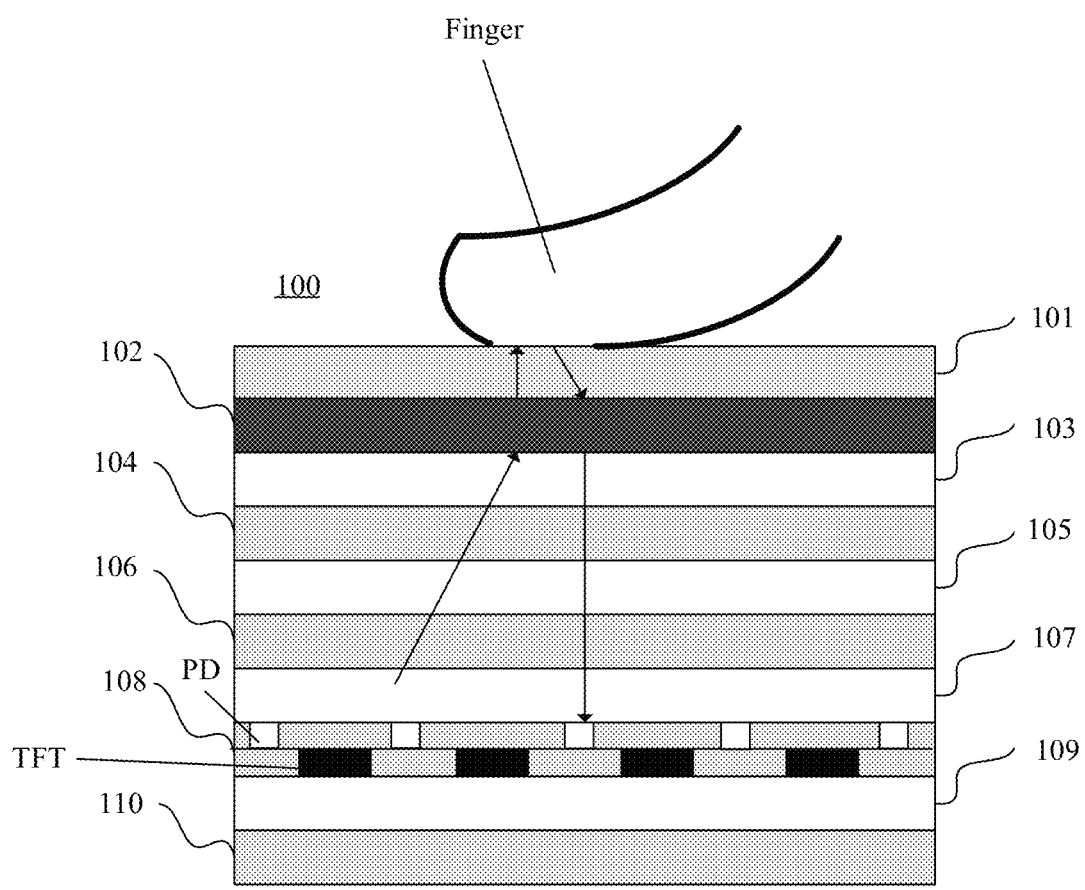
FIG. 9 is a schematic diagram of a principle of an optical path of fingerprint recognition according to an embodiment of this application.

The following briefly describes a principle of an optical path in a fingerprint recognition process, as shown in FIG. 9. An arrow in FIG. 9 represents an optical path of light. Light emitted by the light emitting layer 107 arrives at the collimation structure 102 after successively passing through the electrode layer 106, the package cover plate 105, the touch panel 104, and the polarizer 103, and then passes through the collimation structure 102 to form the collimated light. The collimated light falls onto a finger after passing through the cover glass 101, to form the reflected light. Then, the reflected light passes through the collimation structure 102 to form the collimated reflected light. The collimated reflected light arrives at the TFT layer 108 after successively passing through the polarizer 103, the touch panel 104, the package cover plate 105, the electrode layer 106, and the light emitting layer 107. After receiving the reflected light collimated by the collimation structure 102, the PD located at the TFT layer 108 generates a photogenerated current. In other words, optical-to-electrical conversion is completed. Specifically, a TFT circuit reads an electrical signal corresponding to the photogenerated current. Optionally, the TFT circuit transmits the electrical signal to a processor of a smartphone, and the processor may read fingerprint image information in the electrical signal after performing denoising by using an algorithm, and use the fingerprint image information for recognition. The collimation structure included in the screen display 100 provided in this embodiment of this application can perform collimation processing on light that passes through the collimation structure. In this way, a clearer fingerprint image or more accurate fingerprint image information can be obtained based on the collimated light.

Figure 10:
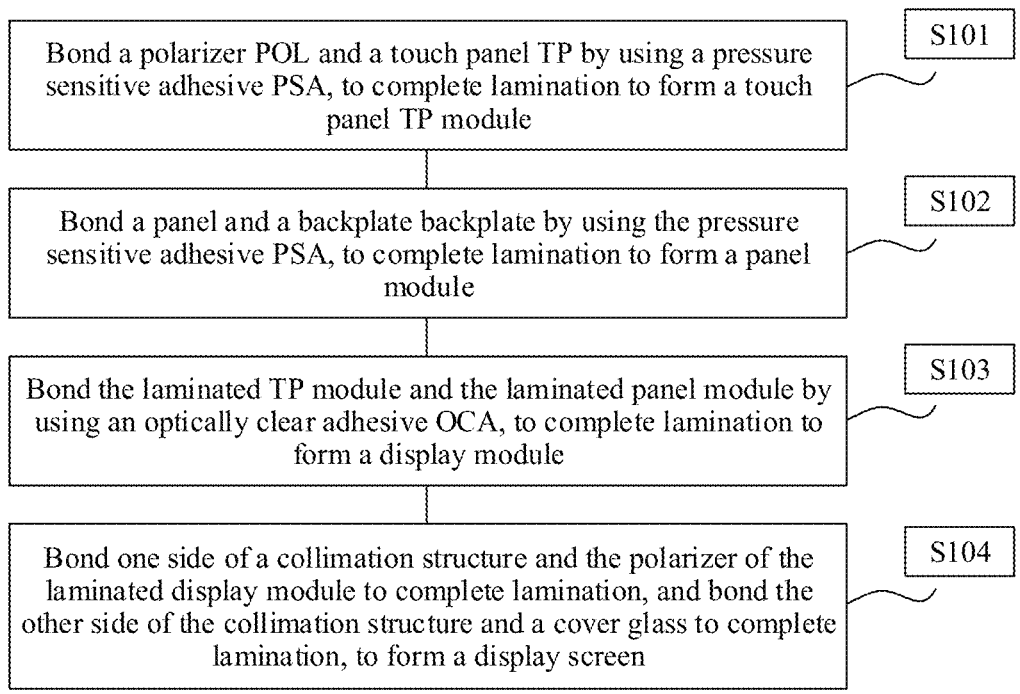
FIG. 10 is a flowchart of a method for assembling a display screen according to an embodiment of this application.
Figure 11:
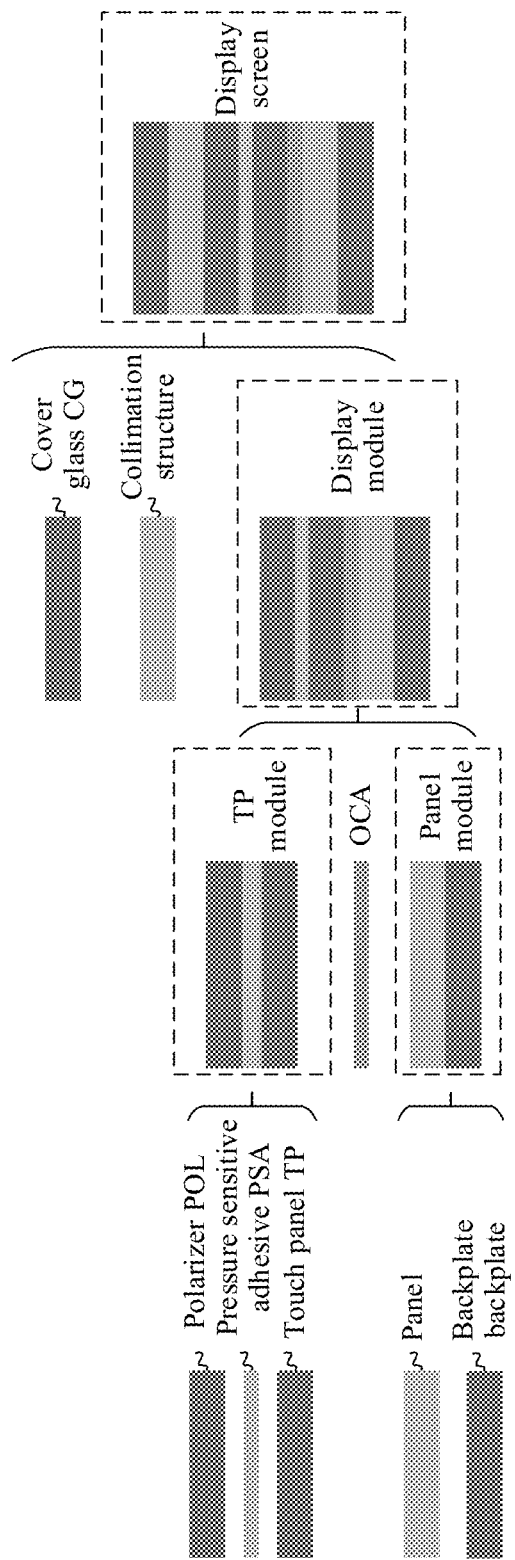
FIG. 11 is a schematic diagram of assembling a display screen according to an embodiment of this application.

An embodiment of this application provides a method for assembling a display screen 100. A touch panel TP module and a panel module may be separately laminated. The TP module includes a polarizer POL and a touch panel. The panel module includes a panel and a backplate. The panel includes a package cover plate, an electrode layer, a light emitting layer, a TFT layer and a base. Refer to FIG. 10 and FIG. 11. A specific assembling method includes the following operations.

S101: Bond the POL and the TP by using pressure sensitive adhesive PSA, to complete lamination to form the TP module.

S102: Bond the panel and the backplate by using the PSA, to complete lamination to form the panel module. Optionally, lamination pressure ranges from 0.1 Mpa to 1 Mpa, and lamination precision is 0.05 mm.

S103: Bond the laminated TP module and the laminated panel module by using an OCA, to complete lamination to form a display module. Optionally, lamination pressure ranges from 0.1 Mpa to 0.5 Mpa. Deaeration parameters of the OCA are as follows: A temperature ranges from 30° C. to 60° C., pressure ranges from 0.2 Mpa to 0.7 Mpa, and preferably ranges from 0.4 Mpa to 0.5 Mpa, and a deaeration time ranges from 10 minutes to 20 minutes.

S104: Bond one side of a collimation structure and the polarizer of the laminated display module by using the OCA, to complete lamination, and bond the other side of the collimation structure and the cover glass CG by using the OCA, to complete lamination, to form the display screen. Ensure that a lamination surface is flat during lamination. Lamination precision is 0.15 mm, lamination pressure ranges from 0.1 Mpa to 0.5 Mpa, and a vacuum degree is less than 100 pa.

In an embodiment of this application, another method for adding the collimation structure 102 to the display screen is provided. Specifically, the collimation structure 102 is obtained by performing processing on a surface of the cover glass 101 by using a process such as laser photoetching or electron beam etching, and after the collimation structure 102 is obtained by using this method, only the cover plate C101 and the polarizer on the TP module need to be bonded. This method can simplify a process flow and reduce a process deviation.

The display screen 100 provided in this embodiment of this application is configured on a terminal/device. It is learned based on a simulation experiment that, in a fingerprint recognition application scenario, a contrast (C4>0.4) achieved is equivalent to a contrast (C4=0.4) achieved in fingerprint recognition on a conventional OLED screen, and fingerprint recognition performance is similar.

In the display screen 100 provided in this embodiment of this application, different quantities of PDs are disposed at the TFT layer, to implement fingerprint recognition regions of different sizes, and even implement fingerprint recognition in a full-screen range. In addition, compared with a conventional solution in which a sensor configured to collect fingerprint image information is disposed under the display screen, the solution in this embodiment of this application implements a fingerprint recognition effect equivalent to a fingerprint recognition effect implemented in the conventional solution, reduces internal space occupied in the terminal (for example, a smartphone) configured with the display screen 100, and reduces the thickness of the terminal. Because the display screen 100 provided in this embodiment of this application further includes the collimation structure, a PD can collect a clearer fingerprint image or more accurate fingerprint image information. This can improve precision and security of fingerprint recognition.

Figure 12:
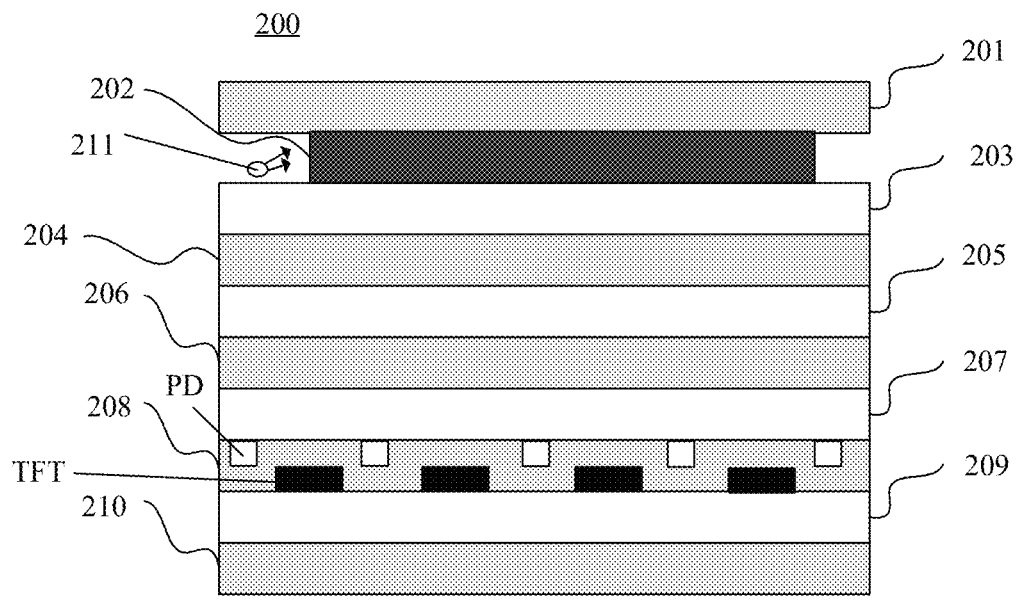
FIG. 12 is a schematic structural diagram of another display screen with a built-in fingerprint recognition module according to an embodiment of this application.

An embodiment of this application provides a display screen 200 with a built-in fingerprint recognition module. The fingerprint recognition module includes a collimation structure, an external light source emitter, and a PD. The display screen 200 is an OLED display screen. Refer to FIG. 5. A smartphone is used as an example. A display screen assembled for the smartphone in FIG. 5 is the display screen 200. FIG. 12 is a schematic diagram of a longitudinal section of a part that is of the display screen 200 and that is used as a fingerprint recognition region. A laminated structure of the display screen 200 is consistent with that of the display screen 100, except for different collimation structures and different light sources used for fingerprint recognition. An area of the collimation structure of the display screen 200 is also different from an area of the collimation structure of the display screen 100. The area of the collimation structure 102 of the display screen 100 may be greater than an area of the fingerprint recognition region, and may be even consistent with an area of the display screen 100. The area of the collimation structure 202 of the display screen 200 is consistent with the area of the fingerprint recognition region. A light source of the display screen 100 is the light emitting layer of the display screen 100 (based on a self-luminescence principle of the OLED screen). The display screen 200 uses the external light source emitter that is separated from a display optical path emitted by the light emitting layer. In an embodiment, light emitted by the external light source emitter is infrared light (an infrared light source). As shown in FIG. 12, the laminated structure of the display screen 200 includes a cover glass 201, the collimation structure 202, a polarizer 203, a touch panel 204, a package cover plate 205, an electrode layer 206, the light emitting layer 207, a TFT layer 208, a base 209, and a backplate 210 in sequence from top to bottom. In addition, the display screen 200 further includes the external light source emitter 211. For related descriptions about the cover glass 201, the polarizer 203, the touch panel 204, the package cover plate 205, the electrode layer 206, the light emitting layer 207, the TFT layer 208, the base 209, and the backplate 210, refer to the embodiment corresponding to the display screen 100. Details are not described herein again. It is particularly noted that a PD arrangement of the display screen 200 is shown in FIG. 12, and is consistent with a PD arrangement of the display screen 100. For related descriptions, refer to specific descriptions about the display screen 100.

It should be noted that materials and specification parameters of the foregoing laminated layers are not limited in this embodiment of this application. In addition, FIG. 12 is a schematic structural diagram of the display screen 200, and does not show all laminated layers or components of the display screen 200, and the laminated layers and the components in FIG. 12 are not drawn strictly according to a scale. Unless otherwise specified, dimensions in FIG. 12 cannot constitute a limitation on the display screen 200 provided in this embodiment of this application.

The external light source emitter 211 of the display screen 200 is located on a plane on which the collimation structure 202 is located, and is located under the cover glass 201. In practice, a specific position of the external light source emitter 211 on the plane on which the collimation structure 202 is located may be determined based on a specific structure of the collimation structure 202. During specific implementation, the external light source emitter 211 is located at a lower position of the plane on which the external light source emitter 211 is located, in other words, is disposed obliquely under the cover glass 201 and close to the collimation structure 202, to make light diagonally enter the collimation structure 202 from a lower part. The area of the collimation structure 202 is consistent with the area of the fingerprint recognition region. Therefore, when the fingerprint recognition region does not occupy a full screen, the external light source emitter 211 does not increase the thickness of the display screen 200. When the fingerprint recognition region occupies the full screen, the external light source emitter 211 is located on an outermost side of the plane on which the external light source emitter 211 is located. In an actual product, there is always some space (in other words, a package edge of the display screen, which is referred to as a "black edge") on a periphery of the display screen 200, and there is sufficient space on an outer side, under the black edge, of the plane on which the collimation structure 202, to dispose the external light source emitter 211. Optionally, the display screen 200 includes a plurality of external light source emitters 211 that are scattered on a light incident side of the collimation structure 202 (the collimation structure is described in detail below, and the light incident side is a side on which light is allowed to enter the collimation structure). In this way, an amount of light projected onto the collimation structure 202 can be increased.

The collimation structure 202 of the display screen 200 is located under the cover glass 201, and has functions of horizontally transmitting light emitted by the external light source emitter 211 and refracting the light upward. During specific implementation, the collimation structure 202 may be a thin film constituted by diffractive optical elements (DOE).

Figure 13:
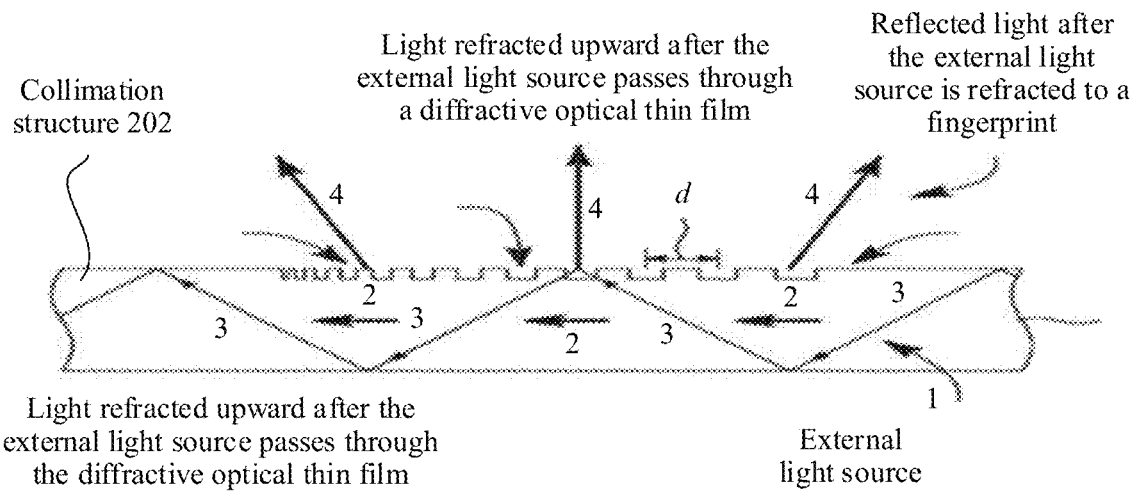
FIG. 13 is a schematic diagram of another collimation structure and a principle of an optical path of fingerprint recognition according to an embodiment of this application.

An embodiment of this application provides a collimation structure. The collimation structure may be applied to the display screen 200. As shown in FIG. 13, arrows in the figure are used to represent different light, and the collimation structure 202 is a diffractive optical element DOE having a periodic arrayed waveguide grating structure. The periodic arrayed waveguide grating structure has a diffraction grating feature. The diffraction grating feature is also referred to as a "diffraction feature", and refers to one or more diffraction features at, inside, and on a surface. The diffraction feature may include any one of various structures of diffractive light, including but not limited to one or more of a groove, a ridge, a void, and a protrusion. The diffraction feature may have any one of various cross-section shapes or contours that provide the diffraction feature, including but not limited to one or more of a sine curve, a rectangular contour (for example, a binary diffraction grating), a triangular contour, and a sawtooth contour. Specifications of the diffraction grating feature include an array spacing D, the depth, the width, and the like. The spacing D ranges from 10 um to hundreds of um, the depth ranges from 1 um to 10 um, and the width ranges from 50 nm to 500 nm. Specific specifications need to be defined based on different design specifications. A design is used as an example. As shown in FIG. 13, a grating feature is divided into three regions. The width of the grating feature ranges from 60 nm to 110 nm, and 80 nm may be selected. The height of the grating feature ranges from 200 nm to 400 nm, and is preferably 300 nm. The single-step height of the grating feature ranges from 40 nm to 80 nm. It should be noted that, that the grating feature is divided into three regions is merely an example. During specific implementation, the grating feature needs to be designed based on a requirement.

A feature of the collimation structure 202 is as follows: After light enters the collimation structure 202 from a single direction, because of a principle of total internal reflection, the light is transmitted along a waveguide propagation direction in a waveguide of the collimation structure 202, so that a light source can be extended. The periodic arrayed diffraction grating structure is distributed on a surface of a waveguide layer. When propagated light passes through the diffraction grating structure, a light direction can be redirected according to a diffraction principle. A structure of the collimation structure 202 enables light from a specific direction to be horizontally transmitted and refracted upward. This does not affect light emitted by the light emitting layer 207 when the display screen 200 is used for normal displaying. In other words, the light emitted by the light emitting layer 207 may pass through the collimation structure 202 without being affected by a diffraction feature of the collimation structure 202. The collimation structure 202 can further collimate reflected light generated after light emitted from the external light source emitter 211 falls, after passing through the collimation structure, onto a fingerprint pressed on the cover glass 201. In this way, the PD can collect a clearer fingerprint image or more accurate fingerprint image information based on the received reflected light.

A diffractive optical material of the collimation structure 202 may be but is not limited to PET, PMMA, or glass. The thickness of the diffractive optical material may range from 0.05 mm to 0.3 mm, and light transmittance of the diffractive optical material is greater than 90%. During specific implementation, the collimation structure 202 may be designed by using titanium dioxide TIO2, aluminum trioxide AL2O3, and an air material, to implement a diffraction grating function. It should be noted that a material actually used for the collimation structure 202 is not limited to the foregoing listed materials.

The following briefly describes a principle of an optical path in a fingerprint recognition process. As shown in FIG. 13, light 1 emitted by the external light source emitter 211 that is disposed obliquely under the cover glass CG falls onto the collimation structure 202, and the collimation structure 202 enables the received light to be horizontally transmitted and vertically transmitted (refracted upward).

Through horizontal transmission, the light may cover a relatively large detection region as much as possible. Through vertical transmission, the light can fall onto a finger on the cover glass 201. Different reflected light that carries fingerprint information is generated at a valley and a ridge of the finger. The reflected light arrives at the PD after passing through each laminated layer of the display screen 200, and fingerprint image information is collected. When the light reflected from the finger passes through the collimation structure 202, the collimation structure 202 collimates the light. Reflective indexes of the valley and the ridge are different. Therefore, energy of the light reflected back to the PD is different, and then a fingerprint image is obtained through mapping. After signal processing and algorithm processing, the fingerprint image can be finally recognized.

For a method for assembling the display screen 200, refer to the method for assembling the display screen 100. Details are not described herein again.

The display screen 200 provided in this embodiment of this application is configured on a terminal/device. It is learned based on a simulation experiment that, in a fingerprint recognition application scenario, a contrast (C4>0.75) achieved is far higher than a contrast (C4=0.4) achieved in fingerprint recognition on a conventional OLED screen. An actual test result shows that a false rejection rate (FRR) of a fingerprint is less than or equal to 4% and a false acceptance rate (FAR) of the fingerprint is less than or equal to 1/50000.

In the display screen 200 provided in this embodiment of this application, different quantities of PDs are disposed at the TFT layer, to implement fingerprint recognition regions of different sizes, and even implement fingerprint recognition in a full-screen range. In addition, compared with a conventional solution in which a sensor configured to collect fingerprint image information is disposed under the display screen, the solution in this embodiment of this application implements a relatively good fingerprint recognition effect, reduces internal space occupied in the terminal (for example, the smartphone) configured with the display screen 200, and reduces the thickness of the terminal. Because the display screen 200 provided in this embodiment of this application further includes the collimation structure, the PD can collect a clearer fingerprint image or more accurate fingerprint image information. This can improve precision and security of fingerprint recognition.

Figure 14:
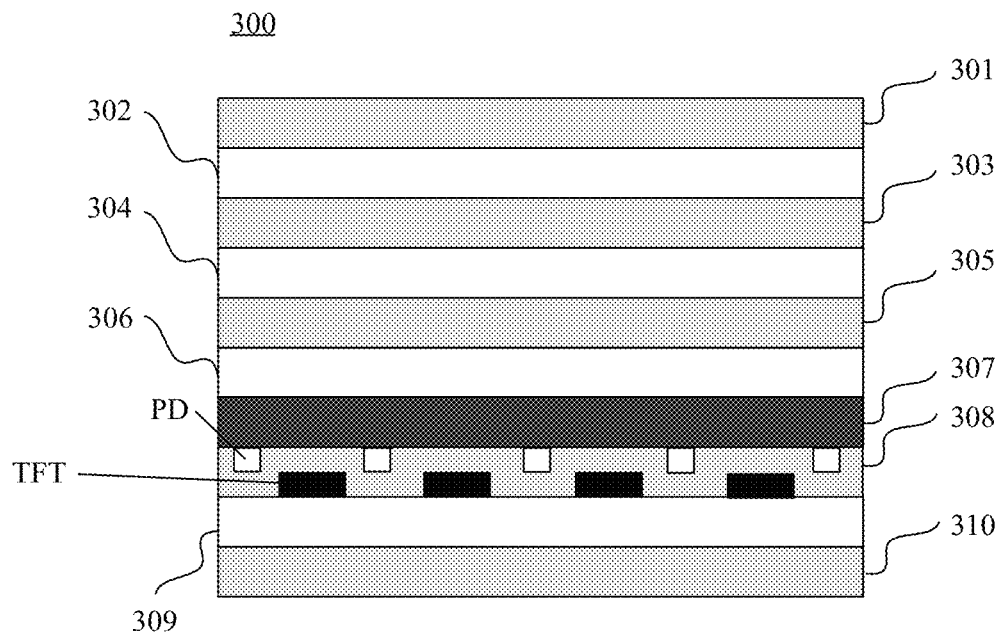
FIG. 14 is a schematic structural diagram of another display screen with a built-in fingerprint recognition module according to an embodiment of this application.

An embodiment of this application provides a display screen 300 with a built-in fingerprint recognition module. The fingerprint recognition module includes a collimation structure and a PD. The display screen 300 is an OLED screen. Refer to FIG. 5. A smartphone is used as an example. A display screen assembled for the smartphone in FIG. 5 is the display screen 300. FIG. 14 is a schematic diagram of a longitudinal section of a part that is of the display screen 300 and that is used as a fingerprint recognition region. As shown in FIG. 14, a laminated structure of the display screen 300 includes a cover glass 301, a polarizer 302, a touch panel 303, a package cover plate 304, an electrode layer 305, a light emitting layer 306, the collimation structure 307, a TFT layer 308, a base 309, and a backplate 310 in sequence from top to bottom. Like the display screen 100, the display screen 300 is improved based on the conventional OLED display screen shown in FIG. 2. As shown in FIG. 14, a PD arrangement of the display screen 300 is consistent with PD arrangements of the display screen 100 and the display screen 200. The PD arrangement of the display screen 300 is not described again. For related descriptions, refer to related descriptions about the display screen 100. A difference between the display screen 300 and the display screen 100 lies in the collimation structure. Different from the collimation structure 102 that is added under the cover glass 101 of the display screen 100, the collimation structure 307 added to the display screen 300 compared with the conventional OLED display screen is located under the light emitting layer 306. The collimation structure 307 is added above the TFT layer 308. This can further improve a collimation effect of light reflected from a fingerprint. In addition, the collimation structure 307 is located under the light emitting layer 306. This can reduce impact of the collimation structure 307 on a displaying effect of the display screen 300. Like a light source used by the display screen 100 for fingerprint recognition, a light source used by the display screen 300 for fingerprint recognition is from a light emitting layer, in other words, from the light emitting layer 306 of the display screen 300.

It should be noted that materials and specification parameters of the foregoing laminated layers are not limited in this embodiment of this application. In addition, FIG. 14 is a schematic structural diagram of the display screen 300, and does not show all laminated layers or components of the display screen 300, and the laminated layers and the components in FIG. 14 are not drawn strictly according to a scale. Unless otherwise specified, dimensions in FIG. 14 cannot constitute a limitation on the display screen 300 provided in this embodiment of this application.

In a fingerprint recognition process, light emitted by the light emitting layer 306 falls onto a finger after passing through various laminated layers above the light emitting layer 306. Because reflective indexes of a valley and a ridge of the finger are different, signal strength of the light reflected by the finger certainly differs (strength of an optical signal represents fingerprint information). In a process in which the reflected light is transmitted to the PD, relatively large crosstalk is generated after the reflected light is scattered by the cover glass 301, the polarizer 302, the touch panel 303, the package cover plate 304, the electrode layer 305, and the light emitting layer 306. As shown in FIG. 14, the collimation structure 307 is located under the light emitting layer 306 of the display screen 300. In such a design, the reflected light that is scattered by the laminated structures can be better collimated, and then the collimated reflected light is transmitted to each PD disposed at the TFT layer 308. This can increase a contrast between bright and dark stripes and make collected fingerprint information clearer.

An embodiment of this application provides a collimation structure. The collimation structure may be applied to the display screen 300. The collimation structure includes a plurality of collimation components, and the plurality of collimation components may be structurally separated from each other or may be connected to each other. In an embodiment, a quantity of the collimation components is the same as a quantity of PDs disposed in the display screen, and the collimation components are located right above the corresponding PDs, in other words, there is one collimation component right above one PD. Optionally, the thickness (or referred to as the height) of the collimation component ranges from 20 um to 50 um. A relatively large thickness is not conducive to processing and molding, and a relatively small thickness cannot implement a light collimation effect.

Figure 15:
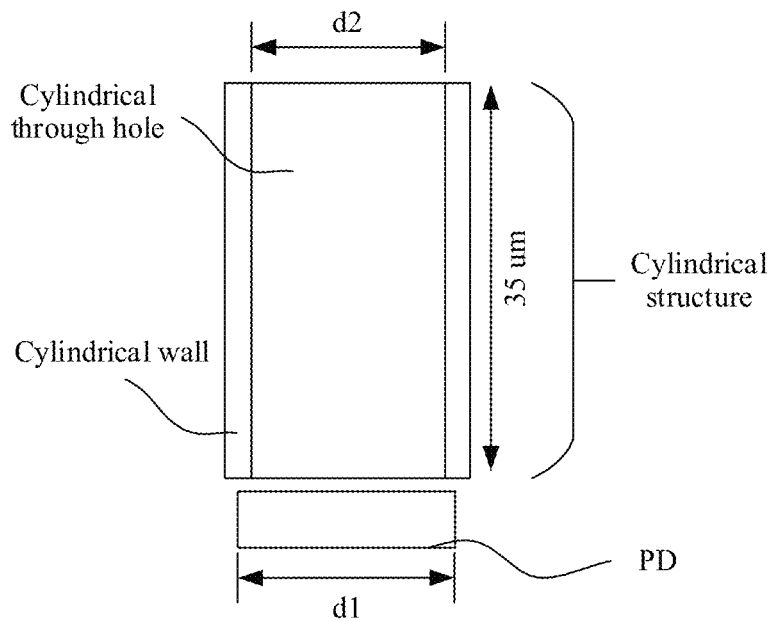
FIG. 15 is a schematic diagram of a cylindrical structure included in a collimation structure according to an embodiment of this application.

During specific implementation, optionally, as shown in FIG. 15, the collimation component is of a cylindrical structure. An example in which the thickness of the cylindrical structure is 35 um is used. The cylindrical structure is located right above the PD. A dimension of a cylindrical through hole (namely, a straight-through hole from an upper surface to a lower surface) of the cylindrical structure is slightly less than a dimension of the PD, which may be represented by using d2<d1. An optional dimension of the cylindrical through hole ranges from 10 um to 20 um, and is preferably 15 um. An outer wall of the cylindrical structure is made of a material having a relatively high light absorption rate, to reduce crosstalk after reflected light is scattered by the cover glass 301, the polarizer 302, the touch panel 303, the package cover plate 304, the electrode layer 305, and the light emitting layer 306. In a specific process of manufacturing the cylindrical structure, optionally, the cylindrical structure is made of PET or PMMA doped with a black-body material, or may be made of another material doped with the black-body material. This is not limited in this embodiment of this application. Then, a cylindrical through-hole structure is implemented through nano-imprinting or laser drilling, to form the cylindrical structure. A cylinder wall of the cylindrical structure is doped with the black-body material, and has a relatively high light absorption rate. This achieves a light shielding effect of the cylinder wall.

Figure 16:
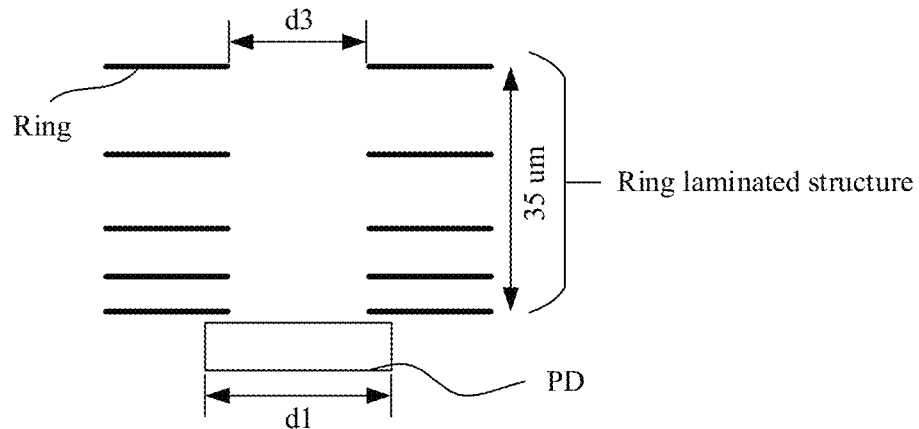
FIG. 16 is a schematic diagram of a ring laminated structure included in a collimation structure according to an embodiment of this application.

In an embodiment, the collimation component is of a ring laminated structure shown in FIG. 16. An example in which the thickness of the ring laminated structure is 35 um is used. The ring laminated structure is located right above the PD. A dimension of an inner diameter of the ring laminated structure is slightly less than a dimension of the PD right under the ring laminated structure, which may be represented by using d3<d1. An optional dimension of the inner diameter of the ring laminated structure ranges from 10 um to 20 um, and is preferably 15 um. The ring laminated structure includes a plurality of rings. The thickness of a single ring ranges from 1 um to 20 um, and the ring may be made of metal with a high light shielding feature, such as TIO2. The rings may be placed at an equal spacing in a thickness direction of the ring laminated structure. Alternatively, the rings may be arranged in a thickness direction of the ring laminated structure in a dense-to-sparse manner, in other words, the plurality of rings are coaxially stacked at a spacing (centers of the plurality of rings are on a same axis). For example, the rings of the ring laminated structure shown in FIG. 16 are arranged from bottom to top in the dense-to-sparse manner. Compared with the cylindrical structure, the ring laminated structure is easier to implement in terms of a process and has lower costs. In a specific process of manufacturing the ring laminated structure, the ring laminated structure can be implemented through semiconductor evaporation.

In an embodiment, a combination of the cylindrical structure and the ring laminated structure may be used for the collimation component included in the collimation structure.

The display screen 300 provided in this embodiment of this application is configured on a terminal/device. It is learned based on a simulation experiment that, in a fingerprint recognition application scenario, a contrast (C4>0.3) achieved is slightly lower than a contrast (C4=about 0.4) achieved in fingerprint recognition on the conventional OLED screen, but may be subsequently compensated for by using an algorithm or by adjusting a backlight collimation angle.

It should be noted that the collimation structure (the collimation structure shown in FIG. 6) provided in the embodiment corresponding to the display screen 100 may alternatively be used for the display screen 300. A difference lies in that, in the display screen 300, the collimation structure (the collimation structure shown in FIG. 6) provided in the embodiment corresponding to the display screen 100 is disposed under the light emitting layer. Likewise, the collimation structure (the collimation structure including the collimation components shown in FIG. 15 and/or FIG. 16) provided in the embodiment corresponding to the display screen 300 may alternatively be used for the display screen 100. A difference lies in that, in the display screen 100, the collimation structure (the collimation structure including the collimation components shown in FIG. 15 and/or FIG. 16) provided in the embodiment corresponding to the display screen 300 is disposed under the cover glass. In an embodiment, when the collimation structure constituted by the collimation components shown in FIG. 15 and/or FIG. 16 is used for the display screen 100, the collimation components (the cylindrical structure or the ring laminated structure) neither need to one-to-one correspond to the PDs nor need to be located right above the PDs, and a layout similar to a layout of the optical fiber transparent structures in the collimation structure shown in FIG. 6 may be used. An area of the collimation structure may be greater than an area of the fingerprint recognition region or even be almost the same as an area of the cover glass. Simply speaking, that the collimation structure constituted by the collimation components shown in FIG. 15 and/or FIG. 16 is used for the display screen 100 actually means that the collimation components shown in FIG. 15 and/or FIG. 16 are used to replace the optical fiber transparent structures 1 and the non-transparent structures 2 in the collimation structure shown in FIG. 6. In other words, an outer wall of the collimation component is equivalent to the non-transparent structure 2, and a through hole inside the collimation component is equivalent to the optical fiber transparent structure 1.

In the display screen 300 provided in this embodiment of this application, different quantities of PDs are disposed at the TFT layer, to implement fingerprint recognition regions of different sizes, and even implement fingerprint recognition in a full-screen range. In addition, compared with a conventional solution in which a sensor configured to collect fingerprint image information is disposed under the display screen, the solution in this embodiment of this application can reduce internal space occupied in the terminal (for example, the smartphone) configured with the display screen 300, and reduce the thickness of the terminal. Because the display screen 300 provided in this embodiment of this application further includes the collimation structure, the PD can collect a clearer fingerprint image or more accurate fingerprint image information. This can improve precision and security of fingerprint recognition.

It should be noted that the display screen 100, the display screen 200, and the display screen 300 provided in the embodiments of this application are all structurally improved based on the conventional OLED display screen. Specifically, the collimation structure and the PD are introduced to implement the built-in fingerprint recognition module, without changing a working principle and an implementation of the display screen when the display screen is used for normal displaying. During normal displaying, working principles and implementations of the display screen 100, the display screen 200, and the display screen 300 are consistent with a working principle and an implementation of the conventional OLED display screen. It should be further noted that a display screen based on a displaying technology such as micro-LED or QLED may also be structurally improved based on the OLED display screen. It should be further noted that the laminated structures of the display screen 100, the display screen 200, and the display screen 300 provided in the embodiments of this application are different from a laminated structure of the conventional OLED display screen. A coupling relationship for applying the display screen 100, the display screen 200, and the display screen 300 to the terminal/device to implement a fingerprint recognition function is not described in detail, and belongs to knowledge mastered by a person skilled in the art. Details are not described herein.

To improve fingerprint recognition performance under strong light and reduce impact of another band on fingerprint image information collection performed by the PD, optionally, a color filter is separately added above each PD of the display screen 100, the display screen 200, and the display screen 300. Specifically, a color filter that allows only light in a green light band to enter the PD is used. An effect of adding, above the PD, the color filter that allows only the light in the green light band to enter the PD is better than an effect achieved when no color filter is added. It can be learned based on a fingerprint recognition simulation result that a contrast C4 is greater than 0.31. Specifically, the color filter may be disposed in a region between pixels of the light emitting layer above the PD.

Figure 17:
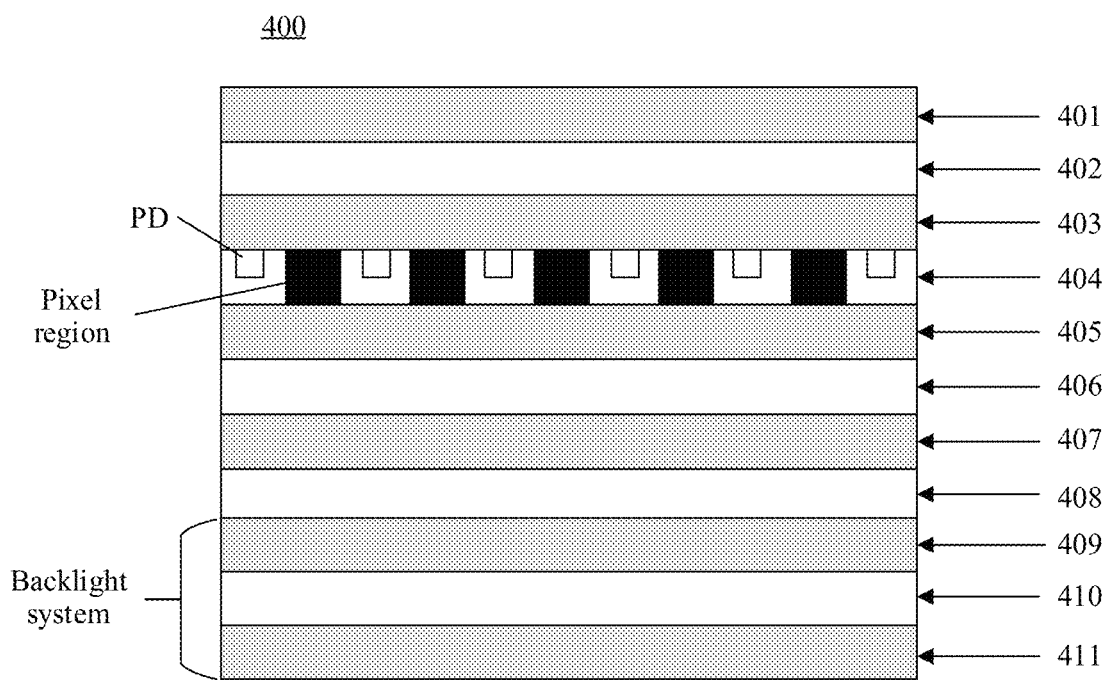
FIG. 17 is a schematic structural diagram of another display screen with a built-in fingerprint recognition module according to an embodiment of this application.

An embodiment of this application provides a display screen 400 with a built-in fingerprint recognition module. The fingerprint recognition module includes a collimation structure and a PD. The display screen 400 is an LCD display screen. Refer to FIG. 5. A smartphone is used as an example. A display screen assembled for the smartphone in FIG. 5 is the display screen 400. FIG. 17 is a schematic diagram of a longitudinal section of a part that is of the display screen 400 and that is used as a fingerprint recognition region. As shown in FIG. 17, a laminated structure of the display screen 400 includes a cover glass 401, an upper polarizer 402, a first substrate (a substrate configured to fasten a color filter) 403, the color filter 404, a liquid crystal layer 405, a TFT layer 406, a second substrate (a substrate configured to fasten a TFT) 407, a lower polarizer 408, a prism film 409, a diffuser 410, and a light guide plate 411 in sequence from top to bottom. The prism film 409, the diffuser 410, and the light guide plate 411 may be collectively referred to as a backlight system.

It should be noted that materials and specification parameters of the foregoing laminated layers are not limited in this embodiment of this application. In addition, FIG. 17 is a schematic structural diagram of the display screen 400, and does not show all laminated layers or components of the display screen 400, and the laminated layers and the components in FIG. 17 are not drawn strictly according to a scale. Unless otherwise specified, dimensions in FIG. 17 cannot constitute a limitation on the display screen 400 provided in this embodiment of this application.

Compared with an existing LCD, the display screen 400 provided in this embodiment of this application further includes the PD configured for fingerprint recognition and the collimation structure. As shown in FIG. 17, a plurality of PDs are integrated on the first substrate 403 of the display screen 400, and each PD is located in a region between pixel regions that are used for displaying and that are on the color filter 404. In other words, the PD is not disposed in a pixel region (for example, R, G, or B—in RGB) that is used for displaying and that is on the color filter 404. In this way, the PD configured for fingerprint recognition can be added without affecting normal displaying performed by the display screen 400. The first substrate 403 is configured to integrate the color filter 404 below, and may also be referred to as a color filter substrate. A quantity of PDs is related to a size of the fingerprint recognition region. During specific implementation, optionally, a larger fingerprint recognition region can be implemented on the display screen 400 by increasing the quantity of PDs. Optionally, a dimension of the PD may range from 10 um to 20 um.

In an embodiment, a solution that is the same as a solution for the collimation structure of the display screen 100 may be used for the collimation structure of the display screen 400, in other words, the collimation structure shown in FIG. 6 is added under the cover glass 401. Optionally, in a fingerprint recognition process, a liquid crystal molecule corresponding to the fingerprint recognition region on the liquid crystal layer 405 may be controlled, to turn on green light in a region under the fingerprint recognition region and use the green light as a light source for fingerprint recognition. In other words, light emitted by the display screen 400 is used as the light source for fingerprint recognition. Turning on the green light can reduce impact of light in another band on an effect of fingerprint recognition. Certainly, the light in the another band may alternatively be turned on as the light source for fingerprint recognition. For example, the green light is turned on. After passing through each corresponding laminated layer, the green light arrives at a finger on the cover glass 404 and is reflected. Then, the reflected light arrives at each PD after passing through each corresponding laminated layer (including the collimation structure). In this way, each PD can collect fingerprint information to obtain fingerprint image information.

In an embodiment, a solution that is the same as a solution for the collimation structure of the display screen 200 may be used for the collimation structure of the display screen 400, in other words, the collimation structure shown in FIG. 13 and the external light source component 211 shown in FIG. 12 are added under the cover glass 401. For specific descriptions about this solution, refer to related descriptions in the embodiment corresponding to the display screen 200. Details are not described herein again.

In an embodiment, a solution that is the same as a solution for the collimation structure of the display screen 300 may be used for the collimation structure of the display screen 400, in other words, the collimation structure is added above the PD. The collimation structure includes the cylindrical structure shown in FIG. 15 and/or a ring laminated layer shown in FIG. 16. For specific descriptions about this solution, refer to related descriptions in the embodiment corresponding to the display screen 300. Details are not described herein again. In this optional solution, the light source for fingerprint recognition may be implemented by using the light emitted by the display screen 400.

The display screen 400 provided in this embodiment of this application is configured on a terminal/device. It is learned based on a simulation experiment that, in a fingerprint recognition application scenario, a contrast (C4>0.6) achieved is far higher than a contrast (C4=about 0.4) achieved in fingerprint recognition on a conventional screen, and fingerprint recognition performance is relatively good.

In the display screen 400 provided in this embodiment of this application, different quantities of PDs are integrated on the first substrate, to implement fingerprint recognition regions of different sizes, and even implement fingerprint recognition in a full-screen range. In addition, compared with a conventional solution in which a sensor configured to collect fingerprint image information is disposed under the display screen, the solution in this embodiment of this application implements a fingerprint recognition effect equivalent to a fingerprint recognition effect implemented in the conventional solution, reduces internal space occupied in the terminal (for example, the smartphone) configured with the display screen 400, and reduces the thickness of the terminal. Because the display screen 400 provided in this embodiment of this application further includes the collimation structure, the PD can collect a clearer fingerprint image or more accurate fingerprint image information. This can improve precision and security of fingerprint recognition.

Figure 18:
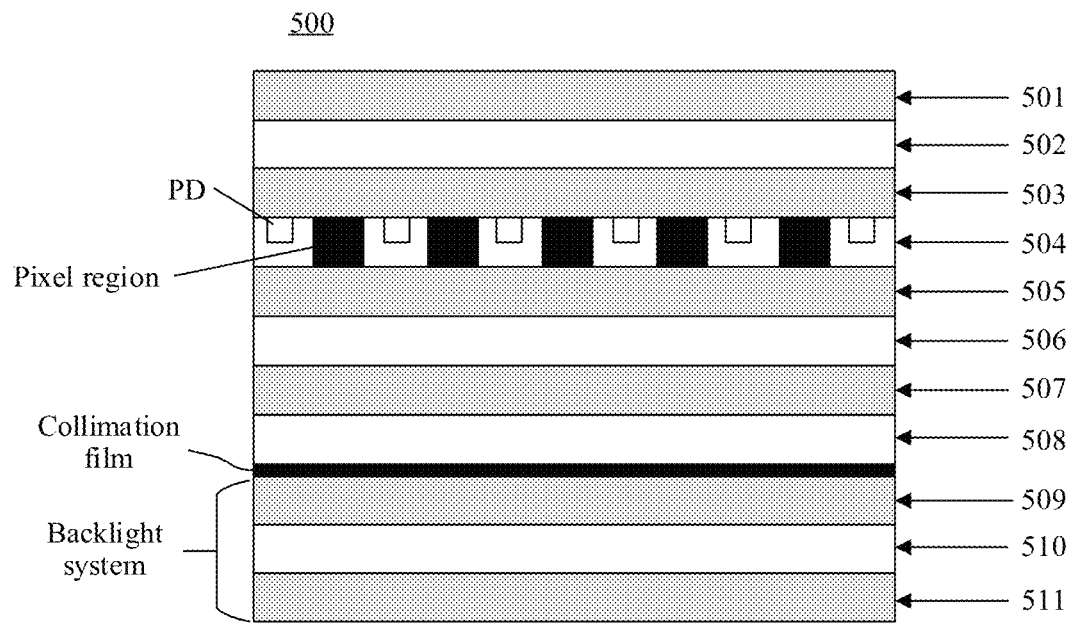
FIG. 18 is a schematic structural diagram of another display screen with a built-in fingerprint recognition module according to an embodiment of this application.

An embodiment of this application provides a display screen 500 with a built-in fingerprint recognition module. The fingerprint recognition module includes a collimation structure and a PD. The display screen 500 is an LCD display screen. Refer to FIG. 5. A smartphone is used as an example. A display screen assembled for the smartphone in FIG. 5 is the display screen 500. FIG. 18 is a schematic diagram of a longitudinal section of a part that is of the display screen 500 and that is used as a fingerprint recognition region. As shown in FIG. 18, a laminated structure of the display screen 500 includes a cover glass 501, an upper polarizer 502, a first substrate (a substrate configured to fasten a color filter) 503, the color filter 504, a liquid crystal layer 505, a TFT layer 506, a second substrate (a substrate configured to fasten a TFT) 507, a lower polarizer 508, a prism film 509, a diffuser 510, and a light guide plate 511 in sequence from top to bottom. The prism film 509, the diffuser 510, and the light guide plate 511 may be collectively referred to as a backlight system.

It should be noted that materials and specification parameters of the foregoing laminated layers are not limited in this embodiment of this application. In addition, FIG. 18 is a schematic structural diagram of the display screen 500, and does not show all laminated layers or components of the display screen 500, and the laminated layers and the components in FIG. 18 are not drawn strictly according to a scale. Unless otherwise specified, dimensions in FIG. 18 cannot constitute a limitation on the display screen 500 provided in this embodiment of this application.

Like the display screen 400, the display screen 500 is also improved based on a conventional LCD. A PD arrangement of the display screen 500 is consistent with a PD arrangement of the display screen 400. In other words, a plurality of PDs are integrated on the first substrate 503, and each PD is located in a region between pixel regions that are used for displaying and that are on the color filter 504. In other words, the PD is not disposed in a pixel region (for example, R, G, or B—in RGB) that is used for displaying and that is on the color filter 504. In this way, the PD configured for fingerprint recognition can be added without affecting normal displaying performed by the display screen 500. The first substrate 503 is configured to integrate the color filter 504 below, and may also be referred to as a color filter substrate. A quantity of PDs is related to a size of the fingerprint recognition region. During specific implementation, optionally, a larger fingerprint recognition region can be implemented on the display screen 500 by increasing the quantity of PDs. Optionally, a dimension of the PD may range from 10 um to 20 um.

In a fingerprint recognition process, the display screen 500 uses light emitted by the display screen 500 as a light source for fingerprint recognition. Specifically, refer to related descriptions in the embodiment corresponding to the display screen 400. Details are not described herein again.

A difference between the display screen 500 and the display screen 400 lies in that the collimation structure of the display screen 500 is configured to collimate backlight, that is, narrow an angle of backlight emitted by the backlight system. During specific implementation, a collimation film may be added above the backlight system. The thickness of the collimation film is designed based on a required backlight angle, and usually ranges from 0.1 mm to 0.7 mm. Other laminated layers are consistent with those of the display screen 400. A specific structure of the collimation film is similar to the collimation structure shown in FIG. 6, and the collimation film may be used to collimate the backlight emitted by the backlight system. Certainly, the structure shown in FIG. 15 or FIG. 16 may alternatively be used for the collimation structure of the display screen 500.

The display screen 500 provided in this embodiment of this application is configured on a terminal/device. It is learned based on a simulation experiment that, in a fingerprint recognition application scenario, a contrast (C4>0.31) achieved is far higher than a contrast (C4=0.13) achieved in fingerprint recognition without backlight collimation on a conventional screen. Therefore, backlight collimation greatly improves fingerprint recognition performance.

In the display screen 500 provided in this embodiment of this application, different quantities of PDs are integrated on the first substrate, to implement fingerprint recognition regions of different sizes, and even implement fingerprint recognition in a full-screen range. In addition, compared with a conventional solution in which a sensor configured to collect fingerprint image information is disposed under the display screen, the solution in this embodiment of this application implements a fingerprint recognition effect equivalent to a fingerprint recognition effect implemented in the conventional solution, reduces internal space occupied in the terminal (for example, the smartphone) configured with the display screen 500, and reduces the thickness of the terminal. Because the display screen 500 provided in this embodiment of this application further includes the collimation film above the backlight system, the PD can collect a clearer fingerprint image or more accurate fingerprint image information. This can improve precision and security of fingerprint recognition.

Figure 19:
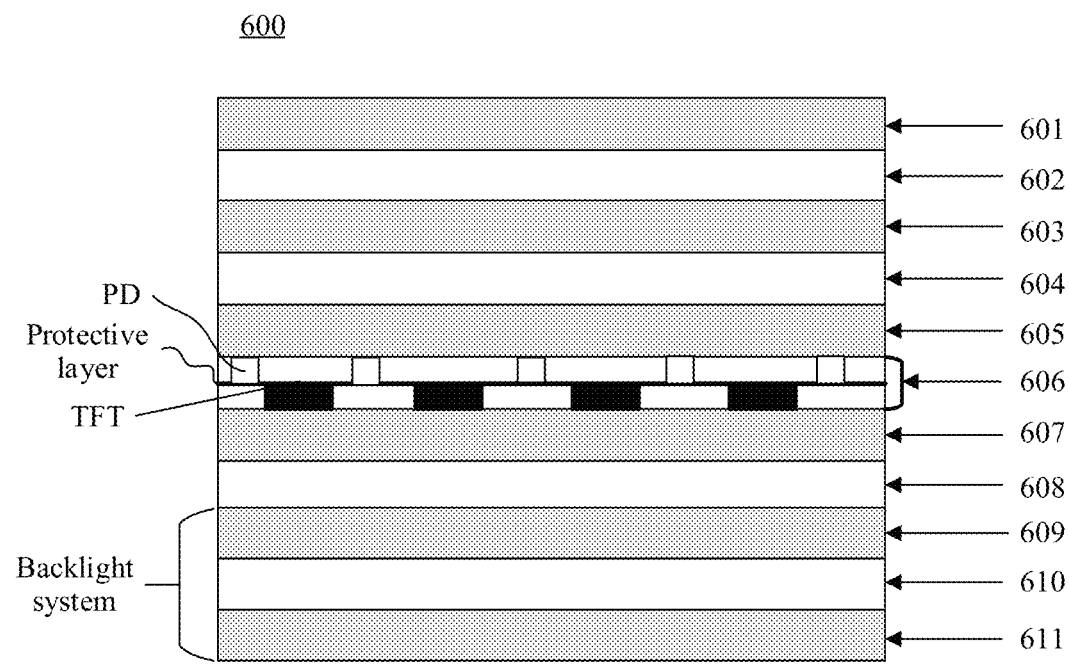
FIG. 19 is a schematic structural diagram of another display screen with a built-in fingerprint recognition module according to an embodiment of this application.

An embodiment of this application provides a display screen 600 with a built-in fingerprint recognition module. The fingerprint recognition module includes a collimation structure and a PD. The display screen 600 is an LCD display screen. Refer to FIG. 5. A smartphone is used as an example. A display screen assembled for the smartphone in FIG. 5 is the display screen 600. FIG. 19 is a schematic diagram of a longitudinal section of a part that is of the display screen 600 and that is used as a fingerprint recognition region. As shown in FIG. 19, a laminated structure of the display screen 600 includes a cover glass 601, an upper polarizer 602, a first substrate (a substrate configured to fasten a color filter) 603, the color filter 604, a liquid crystal layer 605, a TFT layer 606, a second substrate (a substrate configured to fasten a TFT) 607, a lower polarizer 608, a prism film 609, a diffuser 610, and a light guide plate 611 in sequence from top to bottom. The prism film 509, the diffuser 510, and the light guide plate 511 may be collectively referred to as a backlight system.

It should be noted that materials and specification parameters of the foregoing laminated layers are not limited in this embodiment of this application. In addition, FIG. 19 is a schematic structural diagram of the display screen 600, and does not show all laminated layers or components of the display screen 600, and the laminated layers and the components in FIG. 19 are not drawn strictly according to a scale. Unless otherwise specified, dimensions in FIG. 19 cannot constitute a limitation on the display screen 600 provided in this embodiment of this application.

The collimation structure of the display screen 600 provided in this embodiment of this application may be either of the collimation structure of the display screen 400 and the collimation structure of the display screen 500. Specifically, refer to related descriptions in the embodiment corresponding to the display screen 400 and/or the embodiment corresponding to the display screen 500. Details are not described herein again. The display screen 600 differs from the display screen 400 and the display screen 500 in a PD arrangement. In the display screen 400 and the display screen 500, the plurality of PDs are integrated on the first substrate, and each PD is located in the region between the pixel regions used for displaying, to prevent the PD from being disposed in the pixel region that is used for displaying and that is on the color filter. The PD of the display screen 600 is similar to the PD of the display screen 100, and is disposed above the TFT layer 606. As shown in FIG. 19, the PD is located above a region between TFTs. A laminated layer at which the PD is disposed may be referred to as a PD layer. There may be a protective layer between the PD layer and the TFT layer 606, and the protective layer is used to integrate the PD and provide protection. For a specific implementation of the PD, refer to related descriptions in the embodiment corresponding to the display screen 100. Details are not described herein again. A quantity of PDs is related to a size of the fingerprint recognition region. During specific implementation, optionally, a larger fingerprint recognition region can be implemented on the display screen 600 by increasing the quantity of PDs.

In a fingerprint recognition process, a light source may be light emitted by the display screen 600 or may be an external light source component. For a different solution, refer to related descriptions in the embodiment corresponding to the display screen 400. Details are not described herein again.

According to the display screen 600 provided in this embodiment of this application, different quantities of PDs are disposed above the TFT layer 606, to implement fingerprint recognition regions of different sizes, and even implement fingerprint recognition in a full-screen range. In addition, compared with a conventional solution in which a sensor configured to collect fingerprint image information is disposed under the display screen, the solution in this embodiment of this application implements a fingerprint recognition effect equivalent to a fingerprint recognition effect implemented in the conventional solution, reduces internal space occupied in the terminal (for example, the smartphone) configured with the display screen 600, and reduces the thickness of the terminal. Because the display screen 600 provided in this embodiment of this application further includes the collimation structure or the collimation film above the backlight system, the PD can collect a clearer fingerprint image or more accurate fingerprint image information. This can improve precision and security of fingerprint recognition.

Figure 20:
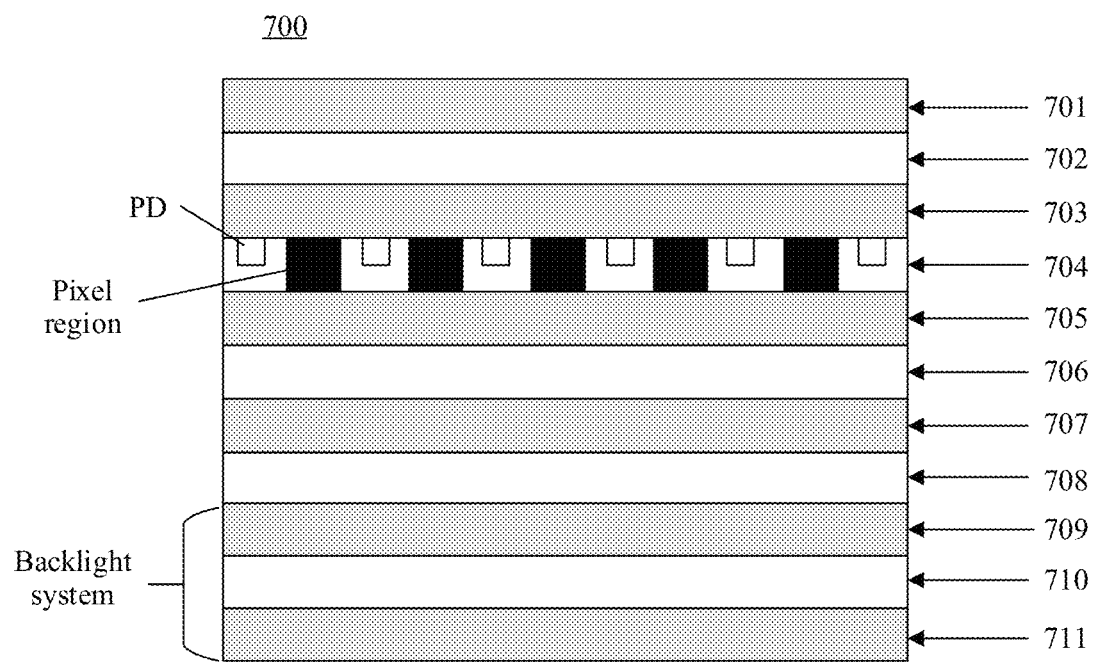
FIG. 20 is a schematic structural diagram of another display screen with a built-in fingerprint recognition module according to an embodiment of this application.

An embodiment of this application provides a display screen 700 with a built-in fingerprint recognition module. The fingerprint recognition module includes a PD. The display screen 700 is an LCD display screen. Refer to FIG. 5. A smartphone is used as an example. A display screen assembled for the smartphone in FIG. 5 is the display screen 700. FIG. 20 is a schematic diagram of a longitudinal section of a part that is of the display screen 700 and that is used as a fingerprint recognition region. As shown in FIG. 20, a laminated structure of the display screen 700 includes a cover glass 701, an upper polarizer 702, a first substrate (a substrate configured to fasten a color filter) 703, the color filter 704, a liquid crystal layer 705, a TFT layer 706, a second substrate (a substrate configured to fasten a TFT) 707, a lower polarizer 708, a prism film 709, a diffuser 710, and a light guide plate 711 in sequence from top to bottom. The prism film 709, the diffuser 710, and the light guide plate 711 may be collectively referred to as a backlight system.

It should be noted that materials and specification parameters of the foregoing laminated layers are not limited in this embodiment of this application. In addition, FIG. 20 is a schematic structural diagram of the display screen 700, and does not show all laminated layers or components of the display screen 700, and the laminated layers and the components in FIG. 20 are not drawn strictly according to a scale. Unless otherwise specified, dimensions in FIG. 20 cannot constitute a limitation on the display screen 700 provided in this embodiment of this application.

Like the display screen 400 and the display screen 500, the display screen 700 provided in this embodiment of this application is improved based on a conventional LCD. A PD arrangement of the display screen 700 is consistent with PD arrangements of the display screen 400 and the display screen 500. In other words, a plurality of PDs are integrated on the first substrate 503, and each PD is located in a region between pixel regions that are used for displaying and that are on the color filter 504. In other words, the PD is not disposed in a pixel region (for example, R, G, or B—in RGB) that is used for displaying and that is on the color filter 504. In this way, the PD configured for fingerprint recognition can be added without affecting normal displaying performed by the display screen 500. The first substrate 503 is configured to integrate the color filter 504 below, and may also be referred to as a color filter substrate. A quantity of PDs is related to a size of the fingerprint recognition region. During specific implementation, optionally, a larger fingerprint recognition region can be implemented on the display screen 500 by increasing the quantity of PDs. Optionally, a dimension of the PD may range from 10 um to 20 um.

In a fingerprint recognition process, the display screen 700 uses light emitted by the display screen 700 as a light source for fingerprint recognition. Specifically, refer to related descriptions in the embodiment corresponding to the display screen 400. Details are not described herein again.

The display screen 700 differs from the display screen 400 and the display screen 500 in that the light guide plate 711 in the backlight system of the display screen 700 is improved based on a conventional LCD to guide light and narrow a backlight angle. Similar to the collimation structure of the display screen 500, a collimation structure of the display screen 700 is configured to collimate backlight. However, different from the display screen 500, the display screen 700 is implemented by adjusting the light guide plate 711 in design. The light guide plate 711 is designed not by using a conventional grid point, but by using a diffraction waveguide structure. Different diffraction orders are used to unidirectionally transmit the light source. A diffraction structure is periodically designed to implement different out-light angles. The light guide plate is further used to implement uniform light mixing and narrow a field of view.

In the display screen 700 provided in this embodiment of this application, when a contrast is not affected, it can be learned from a simulation structure that the light guide plate is designed by using the diffraction waveguide structure, and therefore can narrow an angle from 30 degrees to 15 degrees. A person skilled in the art may perform designing based on an actual requirement to use the diffraction waveguide structure to match different angles.

In the display screen 700 provided in this embodiment of this application, different quantities of PDs are integrated on the first substrate, to implement fingerprint recognition regions of different sizes, and even implement fingerprint recognition in a full-screen range. In addition, compared with a conventional solution in which a sensor configured to collect fingerprint image information is disposed under the display screen, the solution in this embodiment of this application implements a fingerprint recognition effect equivalent to a fingerprint recognition effect implemented in the conventional solution, reduces internal space occupied in the terminal (for example, the smartphone) configured with the display screen 700, and reduces the thickness of the terminal. Because the light guide plate 711 of the display screen 700 provided in this embodiment of this application is designed by using the diffraction waveguide structure, the PD can collect a clearer fingerprint image or more accurate fingerprint image information. This can improve precision and security of fingerprint recognition.

Figure 21:
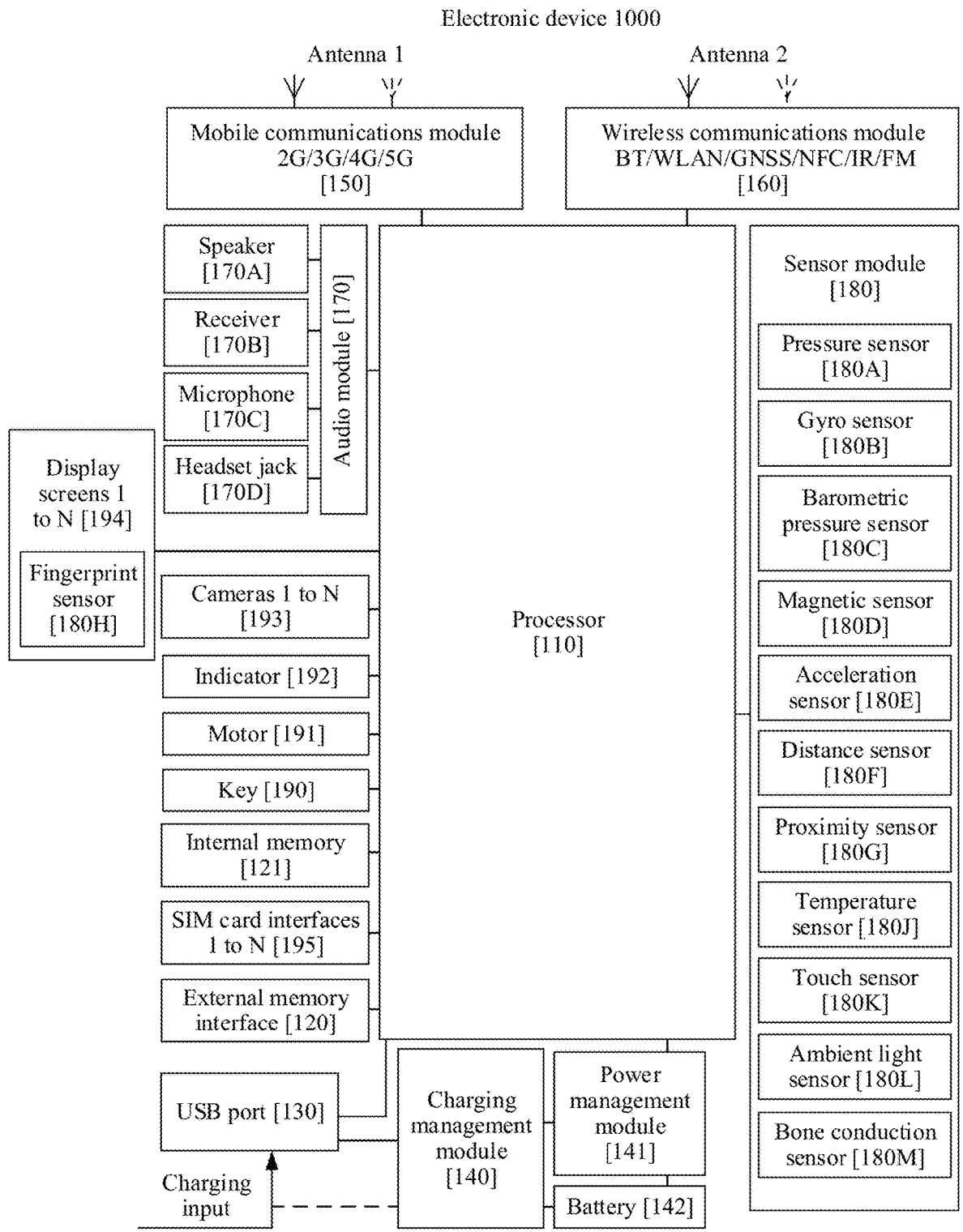
FIG. 21 is a schematic structural diagram of an electronic device according to an embodiment of this application.

FIG. 21 is a schematic structural diagram of an electronic device 1000. The electronic device may be the smartphone shown in FIG. 5. The electronic device 1000 has any one of the display screens 100 to 700 provided in the foregoing embodiments.

The electronic device 1000 may include a processor 110, an external memory interface 120, an internal memory 121, a universal serial bus (USB) port 130, a charging management module 140, a power management unit 141, a battery 142, an antenna 1, an antenna 2, a mobile communications module 150, a wireless communications module 160, an audio module 170, a speaker 170A, a receiver 170B, a microphone 170C, a headset jack 170D, a sensor module 180, a key 190, a motor 191, an indicator 192, a camera 193, a display screen 194, a subscriber identity module SIM) card interface 195, and the like. The sensor module 180 may include a pressure sensor 180A, a gyro sensor 180B, a barometric pressure sensor 180C, a magnetic sensor 180D, an acceleration sensor 180E, a distance sensor 180F, a proximity sensor 180G, a fingerprint sensor 180H, a temperature sensor 180J, a touch sensor 180K, an ambient light sensor 180L, a bone conduction sensor 180M, and the like.

It can be understood that a structure illustrated in this embodiment of the present invention does not constitute a specific limitation on the electronic device 1000. In some other embodiments of this application, the electronic device 1000 may include more or fewer components than those shown in the figure, some components may be combined, some components may be split, or different component arrangements may be used. The components shown in the figure may be implemented by hardware, software, or a combination of software and hardware.

The processor 110 may include one or more processing units. For example, the processor 110 may include an application processor (AP), a modem processor, a graphics processing unit (GPU), an image signal processor (ISP), a controller, a video codec, a digital signal processor (DSP), a baseband processor, and/or a neural-network processing unit (NPU). Different processing units may be independent components, or may be integrated into one or more processors.

The controller may generate an operation control signal based on an instruction operation code and a time sequence signal, to complete control over instruction reading and instruction execution.

The processor 110 may further include a memory configured to store an instruction and data. In some embodiments, the memory in the processor 110 is a cache. The memory may store an instruction or data that is just used or cyclically used by the processor 110. If the processor 110 needs to use the instruction or the data again, the processor 110 may directly invoke the instruction or the data from the memory. This avoids repeated access and reduces a waiting time of the processor 110, thereby improving system efficiency.

In some embodiments, the processor 110 may include one or more interfaces. The interface may include an inter-integrated circuit (I2C) interface, an inter-integrated circuit sound (I2S) interface, a pulse code modulation (PCM) interface, a universal asynchronous receiver/transmitter (UART) interface, a mobile industry processor interface (MIPI), a general-purpose input/output (GPIO) interface, a subscriber identity module (SIM) interface, a universal serial bus (USB) port, and/or the like.

The I2C interface is a two-way synchronous serial bus, and includes one serial data line (SDA) and one serial clock line (SCL). In some embodiments, the processor 110 may include a plurality of groups of I2C buses. The processor 110 may be separately coupled to the touch sensor 180K, a charger, a flash, the camera 193, and the like through different I2C bus interfaces. For example, the processor 110 may be coupled to the touch sensor 180K through the I2C interface, so that the processor 110 communicates with the touch sensor 180K through the I2C bus interface, to implement a touch function of the electronic device 1000.

The I2S interface may be configured to perform audio communication. In some embodiments, the processor 110 may include a plurality of groups of I2S buses. The processor 110 may be coupled to the audio module 170 through an I2S bus, to implement communication between the processor 110 and the audio module 170. In some embodiments, the audio module 170 may transmit an audio signal to the wireless communications module 160 through the I2S interface, to implement a function of answering a call by using a Bluetooth headset.

The PCM interface may also be configured to perform audio communication, and sample, quantize, and encode an analog signal. In some embodiments, the audio module 170 may be coupled to the wireless communications module 160 through a PCM bus interface. In some embodiments, the audio module 170 may alternatively transmit an audio signal to the wireless communications module 160 through the PCM interface, to implement a function of answering a call by using a Bluetooth headset. Both the I2S interface and the PCM interface may be configured to perform audio communication.

The UART interface is a universal serial data bus, and is configured to perform asynchronous communication. The bus may be a two-way communications bus. The bus converts to-be-transmitted data between serial communication and parallel communication. In some embodiments, the UART interface is usually configured to connect the processor 110 to the wireless communications module 160. For example, the processor 110 communicates with a Bluetooth module in the wireless communications module 160 through the UART interface, to implement a Bluetooth function. In some embodiments, the audio module 170 may transmit an audio signal to the wireless communications module 160 through the UART interface, to implement a function of playing music by using the Bluetooth headset.

The MIPI interface may be configured to connect the processor 110 to peripheral components such as the display screen 194 and the camera 193. The MIPI interface includes a camera serial interface (CSI), a display serial interface (DSI), and the like. In some embodiments, the processor 110 communicates with the camera 193 through the CSI interface, to implement a photographing function of the electronic device 1000. The processor 110 communicates with the display screen 194 through the DSI interface, to implement a displaying function of the electronic device 1000.

The GPIO interface may be configured by using software. The GPIO interface may be configured as a control signal or a data signal. In some embodiments, the GPIO interface may be configured to connect to the processor 110, the camera 193, the display screen 194, the wireless communications module 160, the audio module 170, the sensor module 180, and the like. The GPIO interface may alternatively be configured as the I2C interface, the I2S interface, the UART interface, the MIPI interface, or the like.

The USB port 130 is a port that conforms to a USB standard specification, and may be a mini USB port, a micro USB port, a USB type C port, or the like. The USB port 130 may be configured to connect to the charger to charge the electronic device 1000, or may be configured to transmit data between the electronic device 1000 and a peripheral device, or may be configured to connect to a headset to play an audio by using the headset. The USB port 130 may alternatively be configured to connect to another electronic device, such as an AR device.

It can be understood that an interface connection relationship between the modules shown in this embodiment of the present invention is merely an example for description, and does not constitute a limitation on the structure of the electronic device 1000. In some other embodiments of this application, the electronic device 1000 may alternatively use different interface connection manners in the foregoing embodiments, or a combination of a plurality of interface connection manners.

The charging management module 140 is configured to receive a charging input from the charger. The charger may be a wireless charger or a wired charger. In some embodiments of wired charging, the charging management module 140 may receive a charging input of the wired charger through the USB port 130. In some embodiments of wireless charging, the charging management module 140 may receive a wireless charging input through a wireless charging coil of the electronic device 1000. The charging management module 140 supplies, while charging the battery 142, power to the electronic device by using the power management module 141.

The power management module 141 is configured to connect to the battery 142, the charging management module 140, and the processor 110. The power management module 141 receives an input of the battery 142 and/or an input of the charging management module 140, and supplies power to the processor 110, the internal memory 121, the display screen 194, the camera 193, the wireless communications module 160, and the like. The power management module 141 may be further configured to monitor parameters such as a battery capacity, a battery cycle count, and a battery health status (electric leakage or impedance). In some other embodiments, the power management module 141 may alternatively be disposed in the processor 110. In some other embodiments, the power management module 141 and the charging management module 140 may alternatively be disposed in a same component.

A wireless communication function of the electronic device 1000 may be implemented by using the antenna 1, the antenna 2, the mobile communications module 150, the wireless communications module 160, the modem processor, the baseband processor, and the like.

The antenna 1 and the antenna 2 are configured to transmit and receive an electromagnetic wave signal. Each antenna in the electronic device 1000 may be configured to cover one or more communication frequency bands. Different antennas may be further reused, to improve antenna utilization. For example, the antenna 1 may be reused as a diversity antenna in a wireless local area network. In some other embodiments, the antenna may be used in combination with a tuning switch.

The mobile communications module 150 can provide wireless communication solutions applied to the electronic device 1000, including 2G, 3G, 4G, 5G, and the like. The mobile communications module 150 may include at least one filter, a switch, a power amplifier, a low noise amplifier (LNA), and the like. The mobile communications module 150 may receive an electromagnetic wave by using the antenna 1, perform processing such as filtering and amplification on the received electromagnetic wave, and transmit a processed electromagnetic wave to the modem processor for demodulation. The mobile communications module 150 may further amplify a signal modulated by the modem processor, and convert the signal into an electromagnetic wave for radiation by using the antenna 1. In some embodiments, at least some functional modules in the mobile communications module 150 may be disposed in the processor 110. In some embodiments, at least some functional modules in the mobile communications module 150 may be disposed in a same component as at least some modules in the processor 110.

The modem processor may include a modulator and a demodulator. The modulator is configured to modulate a to-be-sent low-frequency baseband signal into a medium-frequency or high-frequency signal. The demodulator is configured to demodulate a received electromagnetic wave signal into a low-frequency baseband signal. Then, the demodulator transmits the low-frequency baseband signal obtained through demodulation to the baseband processor for processing. The low-frequency baseband signal is processed by the baseband processor and then transmitted to the application processor. The application processor outputs a sound signal by using an audio device (which is not limited to the speaker 170A, the receiver 170B, or the like), or displays an image or a video by using the display screen 194. In some embodiments, the modem processor may be an independent component. In some other embodiments, the modem processor may be independent of the processor 110, and is disposed in a same component as the mobile communications module 150 or another functional module.

The wireless communications module 160 can provide wireless communication solutions applied to the electronic device 1000, including a wireless local area network (WLAN) (for example, a wireless fidelity (Wi-Fi) network), Bluetooth (BT), a global navigation satellite system (GNSS), frequency modulation (FM), near field communication (NFC), an infrared (IR) technology, and the like. The wireless communications module 160 may be one or more components integrating at least one communications processor module. The wireless communications module 160 receives an electromagnetic wave by using the antenna 2, performs frequency modulation and filtering on an electromagnetic wave signal, and sends a processed signal to the processor 110. The wireless communications module 160 may further receive a to-be-sent signal from the processor 110, perform frequency modulation and amplification on the signal, and convert the signal into an electromagnetic wave for radiation by using the antenna 2.

In some embodiments, in the electronic device 1000, the antenna 1 and the mobile communications module 150 are coupled, and the antenna 2 and the wireless communications module 160 are coupled, so that the electronic device 100 can communicate with a network and another device by using a wireless communications technology. The wireless communications technology may include a global system for mobile communications (GSM), a general packet radio service (GPRS), code division multiple access (CDMA), wideband code division multiple access (WCDMA), time-division code division multiple access (TD-SCDMA), long term evolution (LTE), BT, the GNSS, the WLAN, NFC, FM, the IR technology, and/or the like. The GNSS may include a global positioning system (GPS), a global navigation satellite system (GLONASS), a BeiDou navigation satellite system (BDS), a quasi-zenith satellite system (QZSS), and/or satellite based augmentation systems (SBAS).

The electronic device 1000 implements the displaying function by using the GPU, the display screen 194, the application processor, and the like. The GPU is a microprocessor for image processing, and is connected to the display screen 194 and the application processor. The GPU is configured to perform mathematical and geometric calculation, and is configured to render an image. The processor 110 may include one or more GPUs that execute a program instruction to generate or change displaying information.

The display screen 194 is configured to display an image, a video, and the like. The display screen 194 includes a display panel. The display panel may be made of a liquid crystal display (LCD), an organic light-emitting diode (OLED), an active-matrix organic light-emitting diode (AMOLED), a flexible light-emitting diode (FLED), a mini-LED, a micro-LED, a micro-OLED, quantum dot light-emitting diodes (QLED), or the like. In some embodiments, the electronic device 1000 may include one or N display screens 194, where N is a positive integer greater than 1. During specific implementation, the display screen 194 is any one of the display screens 100 to 700 described in the foregoing embodiments. Optionally, the display screen 194 is a display screen including a display component to be protected in this application. The display screen 194 includes the fingerprint sensor 180H configured to collect a fingerprint, and the fingerprint sensor is a photo detector PD. The electronic device 1000 may use a feature of the collected fingerprint to implement fingerprint-based unlocking, application lock access, fingerprint-based photographing, fingerprint-based call answering, and the like.

The electronic device 1000 may implement the photographing function by using the ISP, the camera 193, the video codec, the GPU, the display screen 194, the application processor, and the like.

The ISP is configured to process data fed back by the camera 193. For example, during photographing, a shutter is opened, a light ray is transmitted to a photosensitive element of the camera through a lens, and an optical signal is converted into an electrical signal. The photosensitive element of the camera transmits the electrical signal to the ISP for processing, to convert the electrical signal into a visible image. The ISP may further perform algorithm optimization on noise, brightness, and complexion of the image. The ISP may further optimize parameters such as exposure and a color temperature of a photographing scenario. In some embodiments, the ISP may be disposed in the camera 193.

The camera 193 is configured to capture a static image or a video. An optical image is generated for an object by using the lens and is projected onto the photosensitive element. The photosensitive element may be a charge coupled device (CCD) or a complementary metal-oxide-semiconductor (CMOS) phototransistor. The photosensitive element converts an optical signal into an electrical signal, and then transmits the electrical signal to the ISP to convert the electrical signal into a digital image signal. The ISP outputs the digital image signal to the DSP for processing. The DSP converts the digital image signal into an image signal in a standard format such as RGB or YUV. In some embodiments, the electronic device 1000 may include one or N cameras 193, where N is a positive integer greater than 1.

The digital signal processor is configured to process a digital signal. In addition to the digital image signal, the digital signal processor can further process another digital signal. For example, when the electronic device 1000 selects a frequency, the digital signal processor is configured to perform Fourier transform on frequency energy.

The video codec is configured to compress or decompress a digital video. The electronic device 1000 may support one or more types of video codecs. In this way, the electronic device 1000 can play or record videos in a plurality of coding formats, for example, moving picture experts group (MPEG)-1, MPEG-2, MPEG-3, and MPEG-4.

As a neural-network (NN) computing processor, the NPU quickly processes input information by referring to a structure of a biological neural network, for example, by referring to a transfer mode between human brain neurons, and can further perform self-learning continuously. The NPU can be used to implement applications such as intelligent cognition of the electronic device 1000, for example, image recognition, facial recognition, speech recognition, and text understanding.

The external memory interface 120 may be configured to connect to an external storage card, for example, a micro SD card, to extend a storage capability of the electronic device 1000. The external storage card communicates with the processor 110 through the external memory interface 120, to implement a data storage function. For example, files such as music or a video are stored in the external storage card.

The internal memory 121 may be configured to store computer-executable program code, and the executable program code includes an instruction. The internal memory 121 may include a program storage area and a data storage area. The program storage area may store an operating system, an application required by at least one function (for example, a voice playing function and an image playing function), and the like. The data storage area may store data (such as audio data and an address book) created in a process of using the electronic device 1000, and the like. In addition, the internal memory 121 may include a high-speed random access memory, and may further include a nonvolatile memory, for example, at least one magnetic disk storage device, a flash memory device, or a universal flash storage (UFS). The processor 110 runs the instruction stored in the internal memory 121 and/or the instruction stored in the memory disposed in the processor, to execute various function applications of the electronic device 1000 and data processing.

The electronic device 1000 can implement an audio function such as music playing or recording by using the audio module 170, the speaker 170A, the receiver 170B, the microphone 170C, the headset jack 170D, the application processor, and the like.

The audio module 170 is configured to convert digital audio information into an analog audio signal for output, and is also configured to convert an analog audio input into a digital audio signal. The audio module 170 may be further configured to encode and decode an audio signal. In some embodiments, the audio module 170 may be disposed in the processor 110, or some functional modules in the audio module 170 may be disposed in the processor 110.

The speaker 170A, also referred to as a "loudspeaker", is configured to convert an audio electrical signal into a sound signal. The electronic device 1000 may be used to listen to music or answer a call in a hands-free mode by using the speaker 170A.

The receiver 170B, also referred to as an "earpiece", is configured to convert an audio electrical signal into a sound signal. When a call is answered or voice information is listened to by using the electronic device 1000, the telephone receiver 170B may be put close to a human ear to listen to a voice.

The microphone 170C, also referred to as a "mike" or a "voice transmitter", is configured to convert a sound signal into an electrical signal. When making a call or sending voice information, a user may make a sound by moving the mouth of the user close to the microphone 170C, to input a sound signal to the microphone 170C. At least one microphone 170C may be disposed in the electronic device 1000. In some other embodiments, two microphones 170C may be disposed in the electronic device 1000, to collect a sound signal and implement a denoising function. In some other embodiments, three, four, or more microphones 170C may alternatively be disposed in the electronic device 1000, to collect a sound signal, denoise, recognize a sound source, implement a directional recording function, and the like.

The headset jack 170D is configured to connect to a wired headset. The headset jack 170D may be the USB port 130, or may be a 3.5 mm open mobile terminal platform (OMTP) standard interface or a cellular telecommunications industry association of the USA (CTIA) standard interface.

The pressure sensor 180A is configured to sense a pressure signal, and can convert the pressure signal into an electrical signal. In some embodiments, the pressure sensor 180A may be disposed in the display screen 194.

There are many types of pressure sensors 180A, such as a resistive pressure sensor, an inductive pressure sensor, and a capacitive pressure sensor. The capacitive pressure sensor may include at least two parallel plates made of a conductive material. When a force is applied to the pressure sensor 180A, capacitance between electrodes changes. The electronic device 1000 determines pressure intensity based on a capacitance change. When a touch operation is performed on the display screen 194, the electronic device 1000 detects intensity of the touch operation by using the pressure sensor 180A. The electronic device 1000 may further calculate a touch position based on a detection signal of the pressure sensor 180A. In some embodiments, touch operations that are performed on a same touch position but have different touch operation intensity may correspond to different operation instructions. For example, when a touch operation whose touch operation intensity is less than a first pressure threshold is performed on a short message service message application icon, an instruction for viewing a short message service message is executed. When a touch operation whose touch operation intensity is greater than or equal to the first pressure threshold is performed on the short message service message application icon, an instruction for creating a new short message service message is executed.

The gyro sensor 180B may be configured to determine a moving posture of the electronic device 1000. In some embodiments, an angular velocity of the electronic device 1000 around three axes (namely, x, y, and z axes) may be determined by using the gyro sensor 180B. The gyro sensor 180B may be configured to perform image stabilization during photographing. For example, when the shutter is pressed, the gyro sensor 180B detects an angle at which the electronic device 1000 shakes, calculates, based on the angle, a distance for which a lens module needs to compensate, and allows the lens to cancel the shake of the electronic device 1000 through reverse motion, to implement image stabilization. The gyro sensor 180B may be further configured for navigation and a motion sensing game scenario.

The barometric pressure sensor 180C is configured to measure atmospheric pressure. In some embodiments, the electronic device 1000 calculates an altitude based on an atmospheric pressure value measured by the barometric pressure sensor 180C, to assist positioning and navigation.

The magnetic sensor 180D includes a Hall sensor. The electronic device 1000 may detect opening or closing of a flip leather case by using the magnetic sensor 180D. In some embodiments, when the electronic device 1000 is a clamshell phone, the electronic device 1000 may detect opening or closing of a flip cover by using the magnetic sensor 180D. Further, a feature such as automatic unlocking upon opening of the flip cover is set based on a detected opening or closing state of the leather case or a detected opening or closing state of the flip cover.

The acceleration sensor 180E may detect magnitude of accelerations in various directions (usually on three axes) of the electronic device 1000, and may detect magnitude and a direction of gravity when the electronic device 1000 is static. The acceleration sensor 180E may be further configured to recognize a posture of the electronic device, and is applied to an application such as switching between a landscape mode and a portrait mode or a pedometer.

The distance sensor 180F is configured to measure a distance. The electronic device 1000 may measure the distance by using an infrared ray or a laser. In some embodiments, in the photographing scenario, the electronic device 1000 may use the distance sensor 180F to measure a distance to implement quick focusing.

For example, the proximity sensor 180G may include a light-emitting diode (LED) and an optical detector, for example, a photodiode. The light-emitting diode may be an infrared light-emitting diode. The electronic device 1000 emits infrared light by using the light-emitting diode. The electronic device 1000 uses the photodiode to detect infrared reflected light from a nearby object. When sufficient reflected light is detected, the electronic device 1000 may determine that there is an object near the electronic device 1000. When insufficient reflected light is detected, the electronic device 1000 may determine that there is no object near the electronic device 1000. The electronic device 1000 may detect, by using the proximity sensor 180G, that the user holds the electronic device 1000 close to an ear to make a call, so that the electronic device 1000 automatically turns off the screen to save power. The proximity sensor 180G may be further configured to automatically lock and unlock a screen in a smart cover mode and a pocket mode.

The ambient light sensor 180L is configured to sense ambient light brightness. The electronic device 1000 may adaptively adjust brightness of the display screen 194 based on the sensed ambient light brightness. The ambient light sensor 180L may be further configured to automatically adjust white balance during photographing. The ambient light sensor 180L may further cooperate with the proximity sensor 180G to detect whether the electronic device 1000 is in a pocket, to avoid a false touch.

The temperature sensor 180J is configured to detect a temperature. In some embodiments, the electronic device 1000 executes a temperature processing policy based on the temperature detected by the temperature sensor 180J. For example, when the temperature reported by the temperature sensor 180J exceeds a threshold, the electronic device 1000 lowers performance of the processor located near the temperature sensor 180J, to reduce power consumption to implement thermal protection. In some other embodiments, when the temperature is less than another threshold, the electronic device 1000 heats the battery 142 to prevent abnormal shutdown of the electronic device 1000 caused by the low temperature. In some other embodiments, when the temperature is less than still another threshold, the electronic device 1000 boosts an output voltage of the battery 142 to avoid abnormal shutdown caused by the low temperature.

The touch sensor 180K is also referred to as a "touch component". The touch sensor 180K may be disposed in the display screen 194. The touch sensor 180K and the display screen 194 constitute a touch panel that is also referred to as a "touchscreen". The touch sensor 180K is configured to detect a touch operation performed on or near the touch sensor 180K. The touch sensor may transfer the detected touch operation to the application processor to determine a type of a touch event. A visual output related to the touch operation may be provided by using the display screen 194. In some other embodiments, the touch sensor 180K may alternatively be disposed on a surface of the electronic device 1000, and is located at a position different from a position of the display screen 194.

The bone conduction sensor 180M may obtain a vibration signal. In some embodiments, the bone conduction sensor 180M may obtain a vibration signal of vibrating a bone block by a human vocal-cord part. The bone conduction sensor 180M may further contact a body pulse to receive a blood pressure beating signal. In some embodiments, the bone conduction sensor 180M may alternatively be disposed in the headset, to constitute a bone conduction headset. The audio module 170 may obtain a voice signal by parsing the vibration signal that is of vibrating the bone block by the vocal-cord part and that is obtained by the bone conduction sensor 180M, to implement a voice function. The application processor may obtain heart rate information by parsing the blood pressure beating signal obtained by the bone conduction sensor 180M, to implement a heart rate detection function.

The key 190 includes a power key, a volume key, and the like. The key 190 may be a mechanical key or a touch key. The electronic device 1000 may receive a key input, and generate a key signal input related to a user setting and function control of the electronic device 1000.

The motor 191 may generate a vibration prompt. The motor 191 may be configured to provide a vibration prompt for an incoming call, and may be further configured to feed back a touch vibration. For example, touch operations performed on different applications (for example, photographing and audio playing) may correspond to different vibration feedback effects. The motor 191 may also provide different vibration feedback effects for touch operations performed on different regions of the display screen 194. Different application scenarios (for example, a time reminder, information receiving, an alarm clock, and a game) may also correspond to different vibration feedback effects. A touch vibration feedback effect may alternatively be customized.

The indicator 192 may be an indicator lamp. The indicator 192 may be configured to indicate a charging status and a battery level change, and may be further configured to indicate a message, a missed call, a notification, and the like.

The SIM card interface 195 is configured to connect to a SIM card. The SIM card may be inserted into the SIM card interface 195 or plugged out of the SIM card interface 195, to come into contact with or be separated from the electronic device 1000. The electronic device 1000 may support one or N SIM card interfaces, where N is a positive integer greater than 1. The SIM card interface 195 may support a nano-SIM card, a micro-SIM card, the SIM card, and the like. A plurality of cards may be inserted into a same SIM card interface 195 at the same time. The plurality of cards may be of a same type or different types. The SIM card interface 195 may also be compatible with different types of SIM cards. The SIM card interface 195 may also be compatible with the external storage card. The electronic device 1000 interacts with the network by using the SIM card, to implement a call function, a data communication function, and the like. In some embodiments, an eSIM, namely, an embedded SIM card, is used for the electronic device 1000. The eSIM card may be embedded into the electronic device 1000, and cannot be separated from the electronic device 1000.

Finally, it should be noted that the foregoing embodiments are merely intended for describing the technical solutions of this application other than limiting this application. Although this application is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of this application.

What is claimed is:
1. A display screen, comprising:
 a laminated structure including a cover glass, a polarizer, a touch panel, a package cover plate, an electrode layer, a light emitting layer, a thin film transistor (TFT) layer, a base, and a backplate in sequence;
 a collimation structure disposed between the cover glass and the TFT layer;
 an external light source emitter, separate from the light emitting layer, between the cover glass and the TFT layer; and
 a plurality of TFTs and a plurality of photo detectors (PDs) disposed at the TFT layer, wherein the plurality of PDs convert detected light into electrical signals, the plurality of PDs are disposed on a first inner side surface of the TFT layer and the plurality of TFTs are disposed on a second inner side surface of the TFT layer, wherein the first inner side surface and the second inner side surface are two opposite inner side surfaces of the TFT layer, projections of the plurality of PDs and the plurality of TFTs on a first plane are alternately distributed, the first plane is a plane on which the TFT layer is located, and photosensitive sides of the plurality of PDs face a side close to the first inner side surface,
 wherein the cover glass, the polarizer, the touch panel, the package cover plate, the electrode layer, and the light emitting layer are located on a side adjacent the first inner side surface and the base and the backplate are located on a side adjacent the second inner side surface,
 wherein the external light source emitter is disposed in a same horizontal plane as the collimation structure at a lateral edge of the collimation structure,
 wherein the collimation structure includes a diffractive optical element (DOE) that has a feature of transmitting light emitted by the external light source emitter horizontally within the collimation structure and refracting the light upward in the collimation structure,
 wherein the DOE comprises a periodic arrayed waveguide grating structure having a diffraction grating feature, the diffraction grating feature including an array spacing ranging from approximately 10 um to hundreds of um, a depth ranging from approximately 1 um to 10 um, and a width ranging from approximately 50 nm to 500 nm, and wherein the light emitted by the external light source emitter transmits horizontally between the periodic arrayed waveguide grating structure and the TFT layer.

2. The display screen according to claim 1, wherein the plurality of PDs have same dimensions and specifications, and a plane on which side surfaces of the plurality of PDs, close to the second inner side surface, are located does not intersect a plane on which side surfaces of the plurality of TFTs, close to the first inner side surface, are located, and
wherein a protective layer is disposed on the side surfaces of the plurality of PDs, close to the second inner side surface, and the plurality of PDs are integrated at the protective layer.

3. The display screen according to claim 2, wherein the protective layer is situated in between a PD layer comprising the plurality of PDs and the portion of the TFT layer comprising the plurality of TFTs, wherein the protective layer separates the PD layer and the portion of the TFT layer.

4. The display screen according to claim 1,
wherein the external light source emitter is located on a light incident side of the collimation structure.

5. The display screen according to claim 1, further comprising a color filter stacked above the photosensitive sides of the plurality of PDs, wherein the color filter has a feature of allowing only light in a green light band to pass through.

6. The display screen according to claim 1, wherein the plurality of PDs are disposed in a layer that does not intersect a layer of the plurality of TFTs.

7. The display screen according to claim 1, wherein the collimation structure comprises one of materials: silicon dioxide (SiO2), polyethylene terephthalate (PET), polymethyl methacrylate (PMMA), titanium dioxide (TiO2), aluminum trioxide (Al2O3), or an air material.

8. A display screen, comprising:
a laminated structure including a cover glass, an upper polarizer, a first substrate, a color filter, a liquid crystal layer, a thin film transistor (TFT) layer, a second substrate, a lower polarizer, a prism film, a diffuser, and a light guide plate in sequence, wherein the color filter comprises a plurality of pixel regions and is disposed on a first side surface of the first substrate;
a collimation structure disposed between the cover glass and the TFT layer;
an external light source emitter between the cover glass and the TFT layer; and
a plurality of photo detectors (PDs) disposed on the first side surface of the first substrate, wherein projections of the plurality of PDs and the plurality of pixel regions on a plane on which the first substrate is located are alternately distributed,
wherein the cover glass, the upper polarizer, the first substrate, the color filter, and the liquid crystal layer are located on a side of the TFT layer adjacent a first inner side surface, and the second substrate, the lower polarizer, the prism film, the diffuser, and the light guide plate are located on a side of the TFT layer adjacent a second inner side surface,
wherein the external light source emitter is disposed in a same horizontal plane as the collimation structure at a lateral edge of the collimation structure,
wherein the collimation structure includes a diffractive optical element (DOE) that has a feature of transmitting light emitted by the external light source emitter horizontally within the collimation structure and refracting the light upward in the collimation structure,
wherein the DOE comprises a periodic arrayed waveguide grating structure having a diffraction grating feature, the diffraction grating feature including an array spacing ranging from approximately 10 um to hundreds of um, a depth ranging from approximately 1 um to 10 um, and a width ranging from approximately 50 nm to 500 nm, and
wherein the light emitted by the external light source emitter transmits horizontally between the periodic arrayed waveguide grating structure and the TFT layer.

9. The display screen according to claim 8,
wherein the external light source emitter is located on a light incident side of the collimation structure.

10. A display screen, comprising:
a laminated structure including a cover glass, an upper polarizer, a first substrate, a color filter, a liquid crystal layer, a thin film transistor (TFT) layer, a second substrate, a lower polarizer, a prism film, a diffuser, and a light guide plate in sequence;
a collimation structure disposed between the cover glass and the TFT layer;
an external light source emitter between the cover glass and the TFT layer; and
a plurality of TFTs and a plurality of photo detectors (PDs) disposed at the TFT layer, the plurality of PDs convert detected light into electrical signals, the plurality of PDs are disposed on a first inner side surface of the TFT layer, the plurality of TFTs are disposed on a second inner side surface of the TFT layer opposite to the first inner side surface, wherein projections of the plurality of PDs and the plurality of TFTs on a first plane are alternately distributed, the first plane is a plane on which the TFT layer is located, and photosensitive sides of the plurality of PDs face a side close to the first inner side surface,
wherein the cover glass, the upper polarizer, the first substrate, the color filter, and the liquid crystal layer are located on a side of the TFT layer adjacent the first inner side surface, and wherein the second substrate, the lower polarizer, the prism film, the diffuser, and the light guide plate are located on a side of the TFT layer adjacent the second inner side surface,
wherein the external light source emitter is disposed in a same horizontal plane as the collimation structure at a lateral edge of the collimation structure,
wherein the collimation structure includes a diffractive optical element (DOE) that has a feature of transmitting light emitted by the external light source emitter horizontally within the collimation structure and refracting the light upward in the collimation structure,
wherein the DOE comprises a periodic arrayed waveguide grating structure having a diffraction grating feature, the diffraction grating feature including an array spacing ranging from approximately 10 um to hundreds of um, a depth ranging from approximately 1 um to 10 um, and a width ranging from approximately 50 nm to 500 nm, and
wherein the light emitted by the external light source emitter transmits horizontally between the periodic arrayed waveguide grating structure and the TFT layer.

11. The display screen according to claim 10,
wherein the external light source emitter is located on a light incident side of the collimation structure.

* * * * *